United States Patent [19]
Nishimura

[11] Patent Number: 5,844,831
[45] Date of Patent: Dec. 1, 1998

[54] FERROELECTRIC MEMORY DEVICES AND METHODS OF USING FERROELECTRIC CAPACITORS

[75] Inventor: Kiyoshi Nishimura, Kyoto, Japan

[73] Assignee: Rohm Co., Ltd., Kyoto, Japan

[21] Appl. No.: 987,294

[22] Filed: Dec. 9, 1997

Related U.S. Application Data

[62] Division of Ser. No. 749,657, Nov. 15, 1996, Pat. No. 5,764,561.

[30] Foreign Application Priority Data

Nov. 16, 1996 [JP] Japan .................................. 7-298491
Nov. 16, 1996 [JP] Japan .................................. 7-298492
Jan. 24, 1997 [JP] Japan .................................. 8-009855

[51] Int. Cl.[6] .................................................. G11C 11/22
[52] U.S. Cl. .......................... 365/145; 365/149; 365/210; 257/295
[58] Field of Search .................................. 365/145, 149, 365/210; 257/295, 310; 361/321.1

[56] References Cited

U.S. PATENT DOCUMENTS 5,517,445  5/1996  Motomasa et al. ...................... 365/145
5,621,680  4/1997  Newman et al. ........................ 365/145
5,724,283  3/1998  Tai .......................................... 365/145
5,751,626  5/1998  Seyyedy ................................. 365/145

Primary Examiner—David C. Nelms
Assistant Examiner—Hien Nguyen
Attorney, Agent, or Firm—Majestic, Parsons, Siebert & Hsue P.C.

[57] ABSTRACT

A ferroelectric memory device has a ferroelectric memory capacitor with a hysteresis characteristic adapted to store either a first memory content corresponding to a first polarization condition or a second memory content corresponding to a second polarization condition when there is no applied voltage. A first load capacitor is connected in series with the memory capacitor, and a second load capacitor is connected in series with a reference capacitor. The first and second capacitors are both ferroelectric capacitors and have substantially the same characteristics as the memory capacitor. The ratio of area between the reference and second capacitors is such that Veff (the partial voltage which appears across the reference capacitor if a specified voltage is applied to the series connection of the reference capacitor and the second load capacitor) is nearly equal to the average of V1 (the partial voltage which appears across the memory capacitor if the specified voltage is applied to the series connection of the memory capacitor and the first load capacitor when the memory capacitor is in the first polarization condition) and V2 (the partial voltage which appears across the memory capacitor if the specified voltage is applied to the series connection of the memory capacitor and the first load capacitor when the memory capacitor is in the second polarization condition) or slightly closer to V1 from the average.

6 Claims, 18 Drawing Sheets

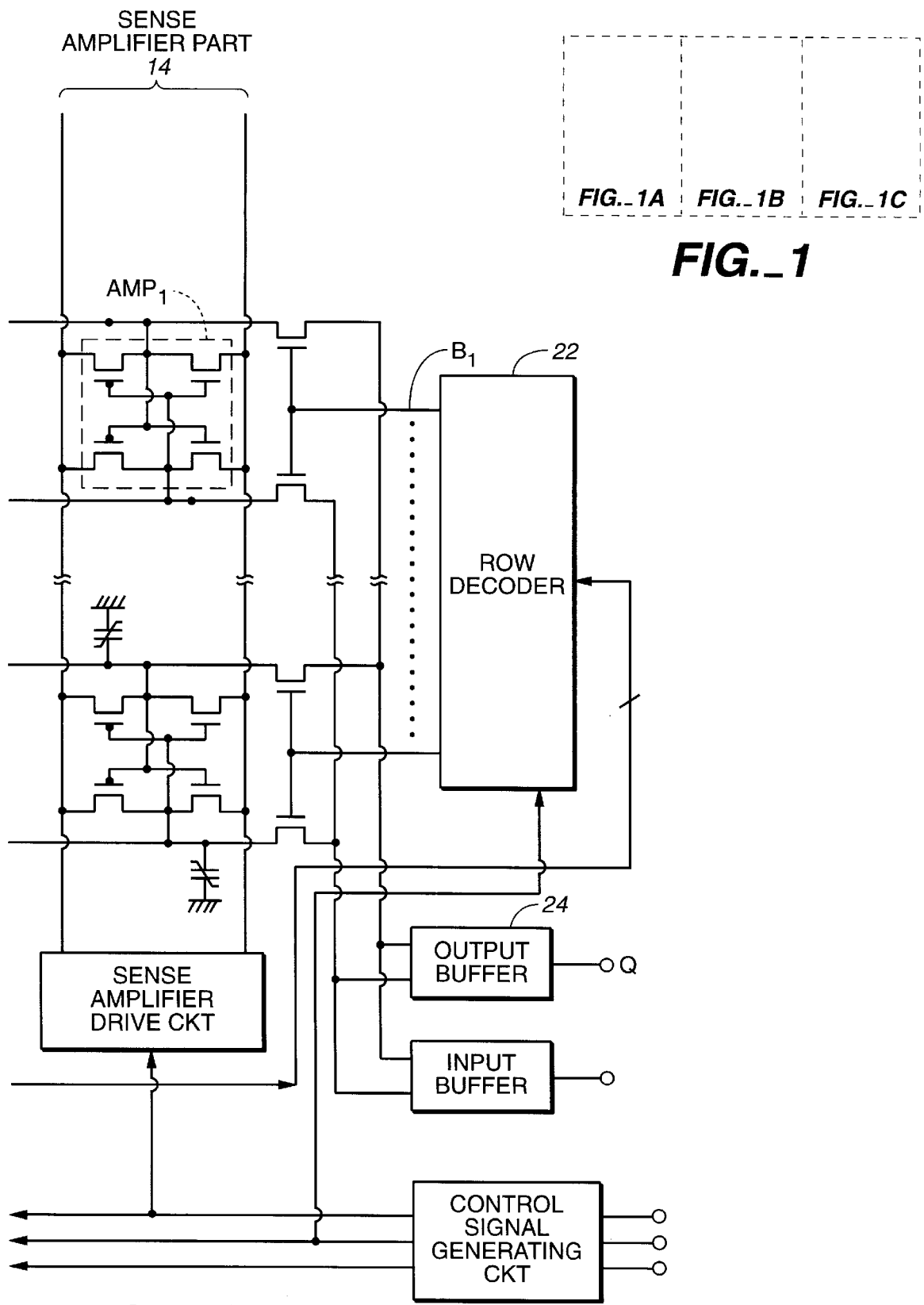

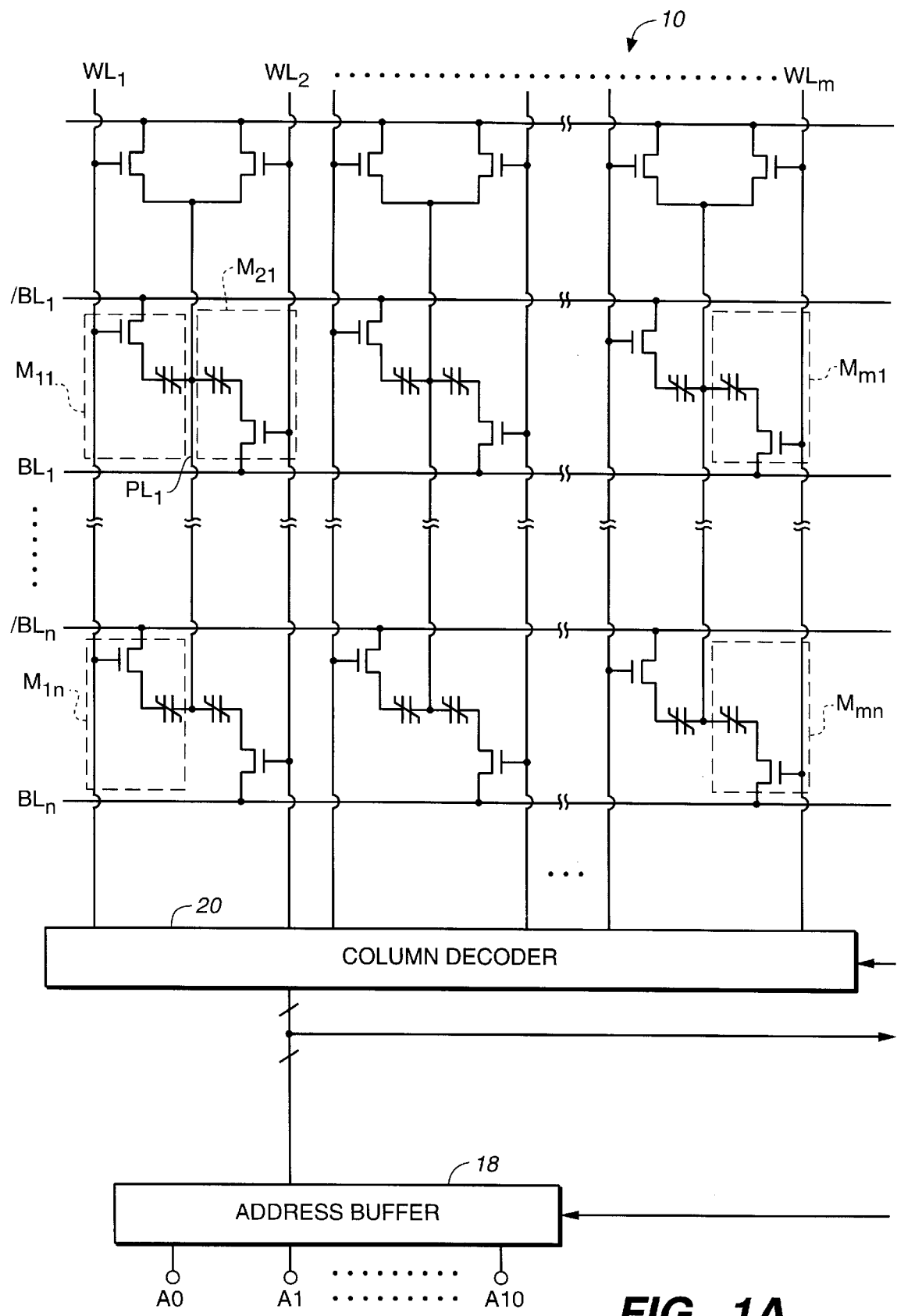
FIG._1A

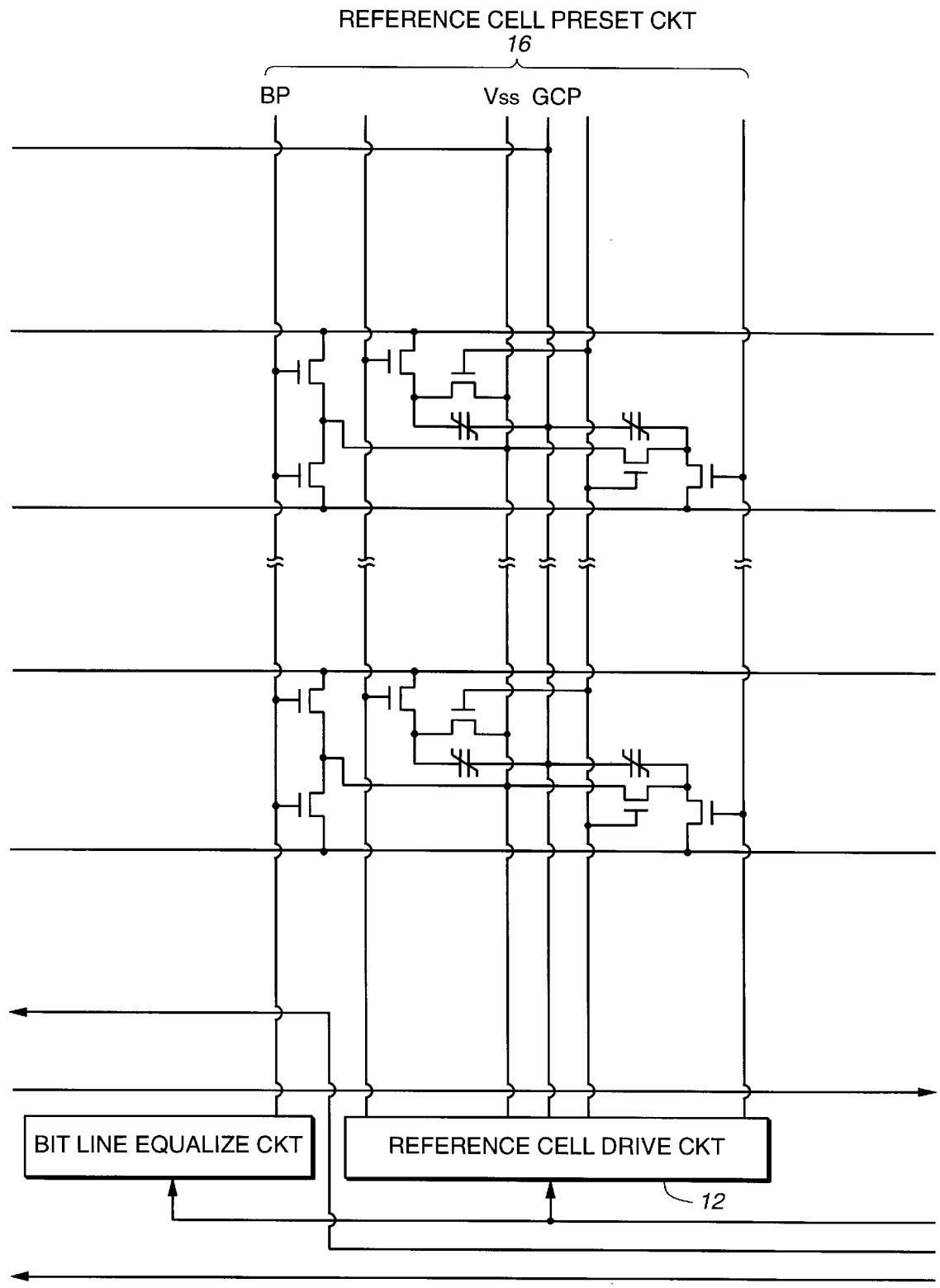
FIG._1B

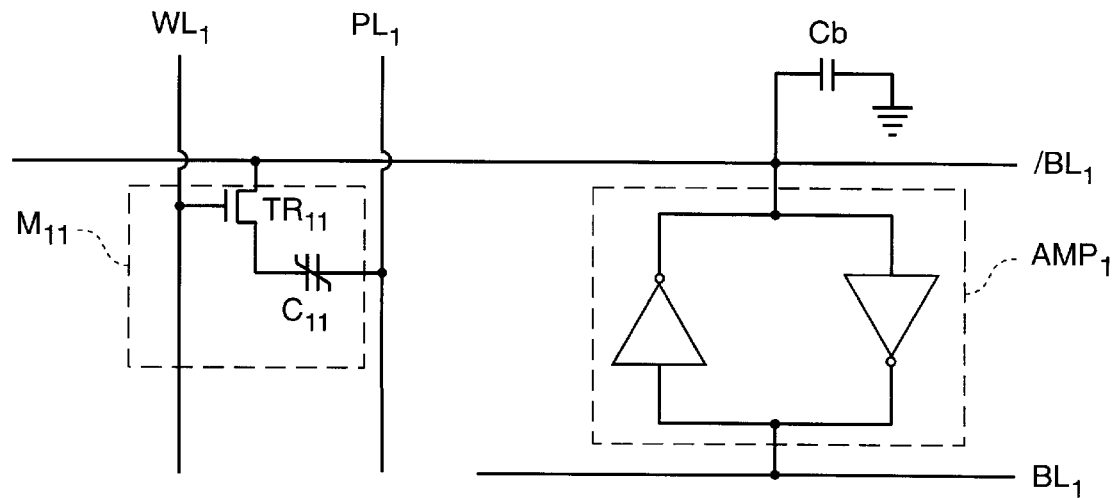
FIG._2
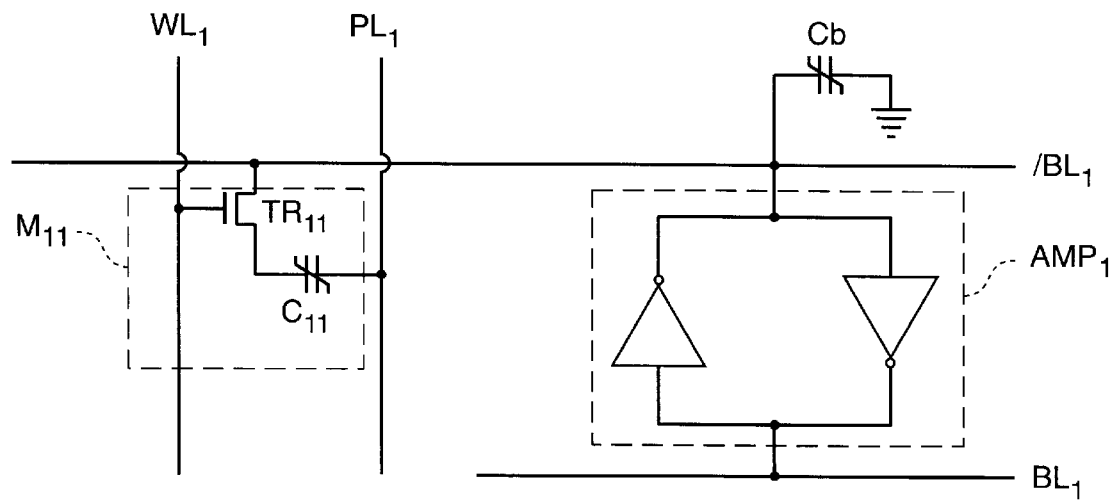
FIG._9

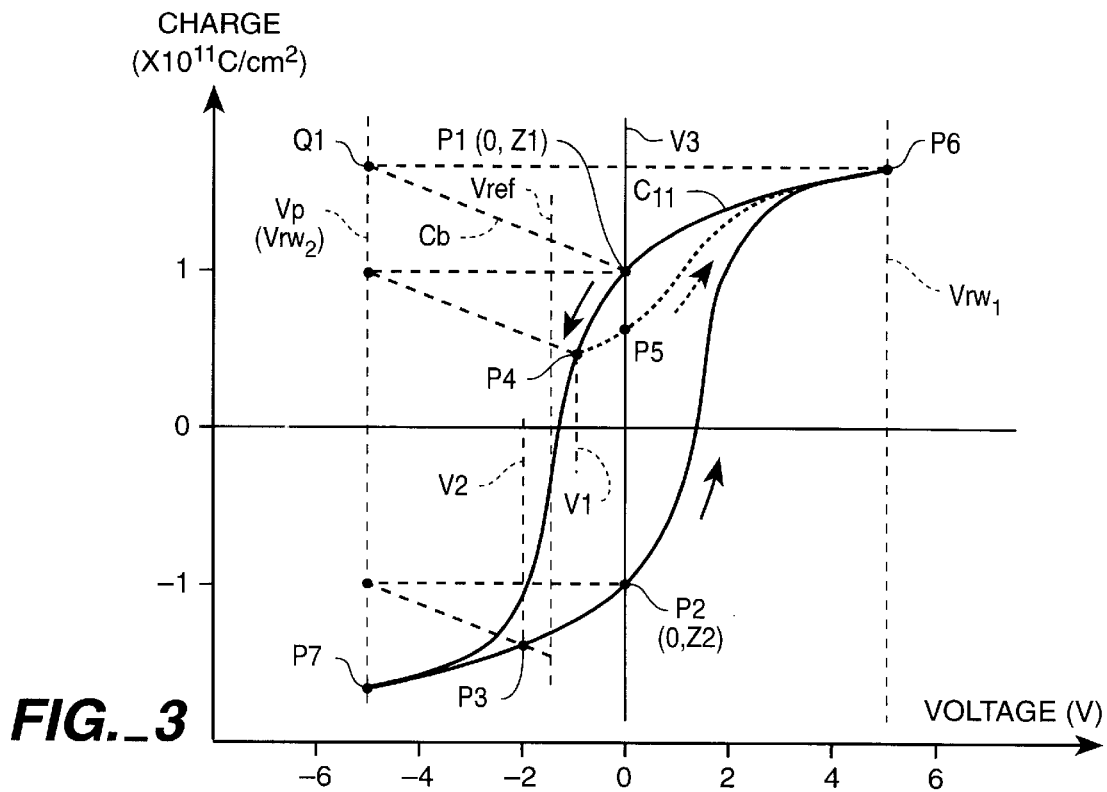
FIG._3
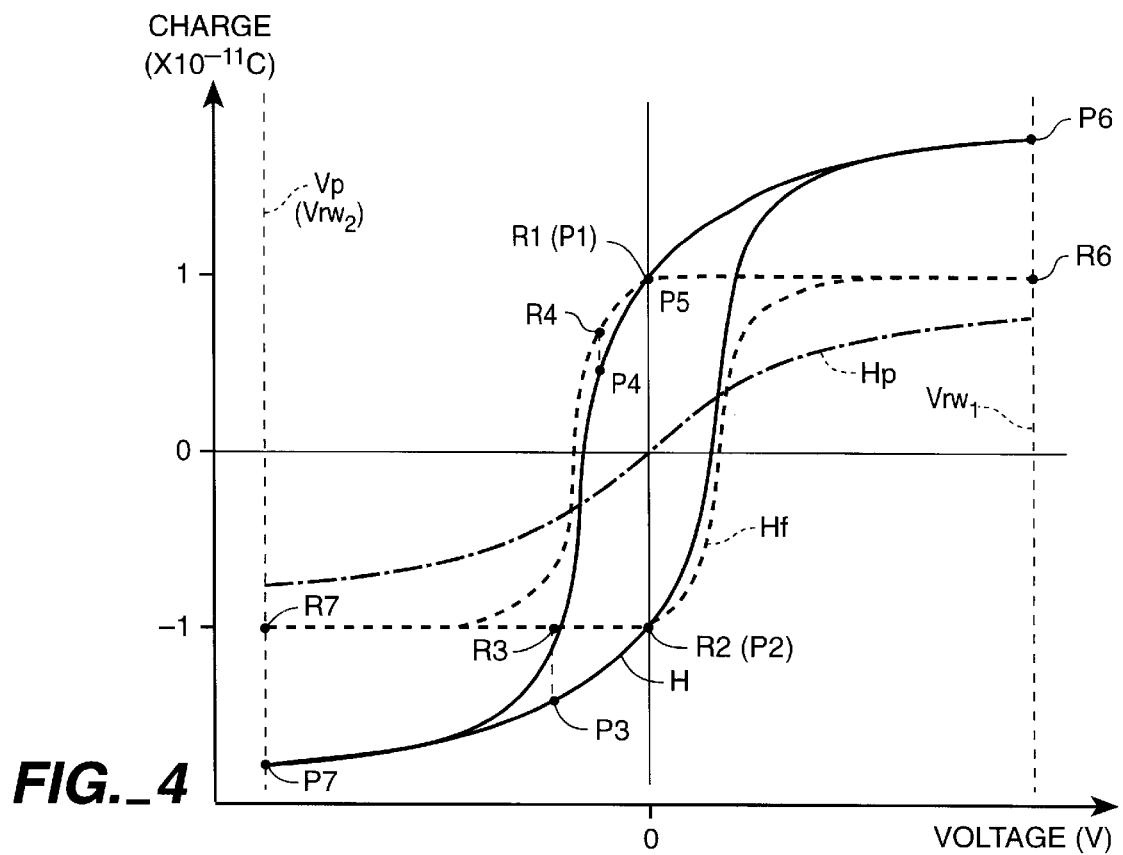
FIG._4

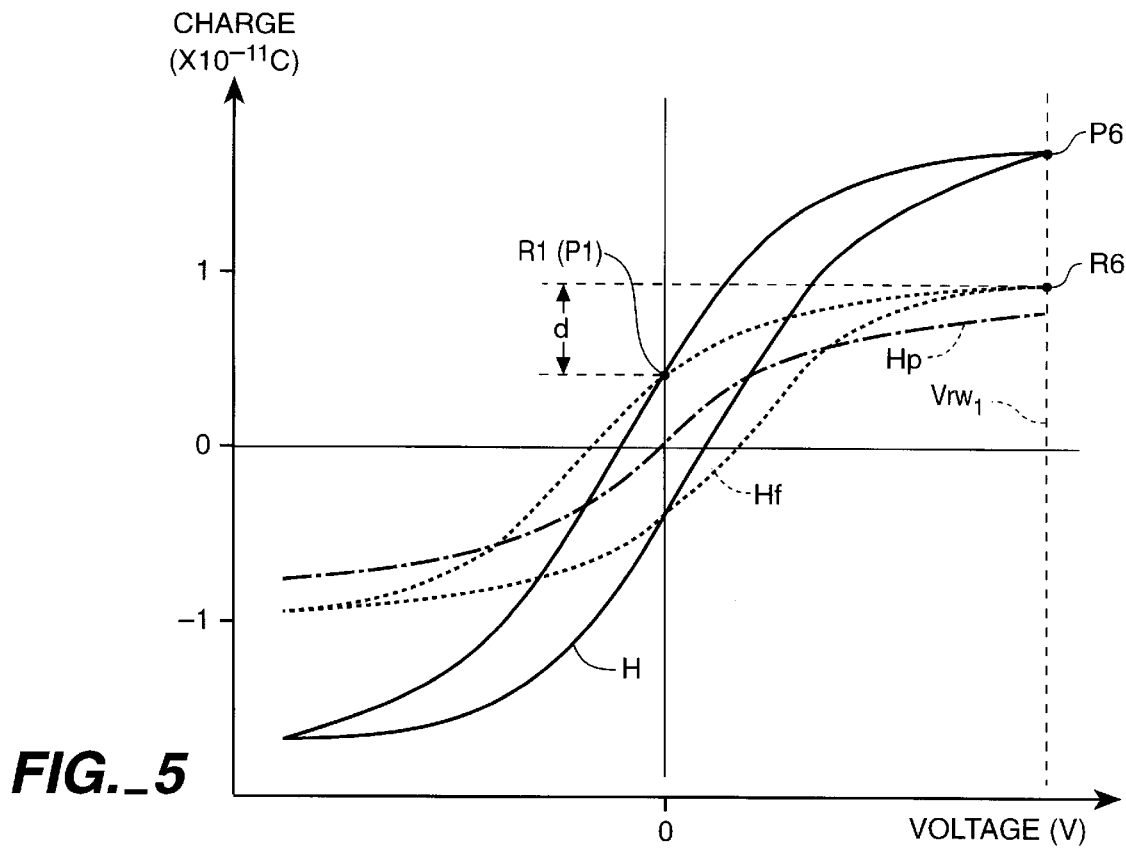
FIG._5
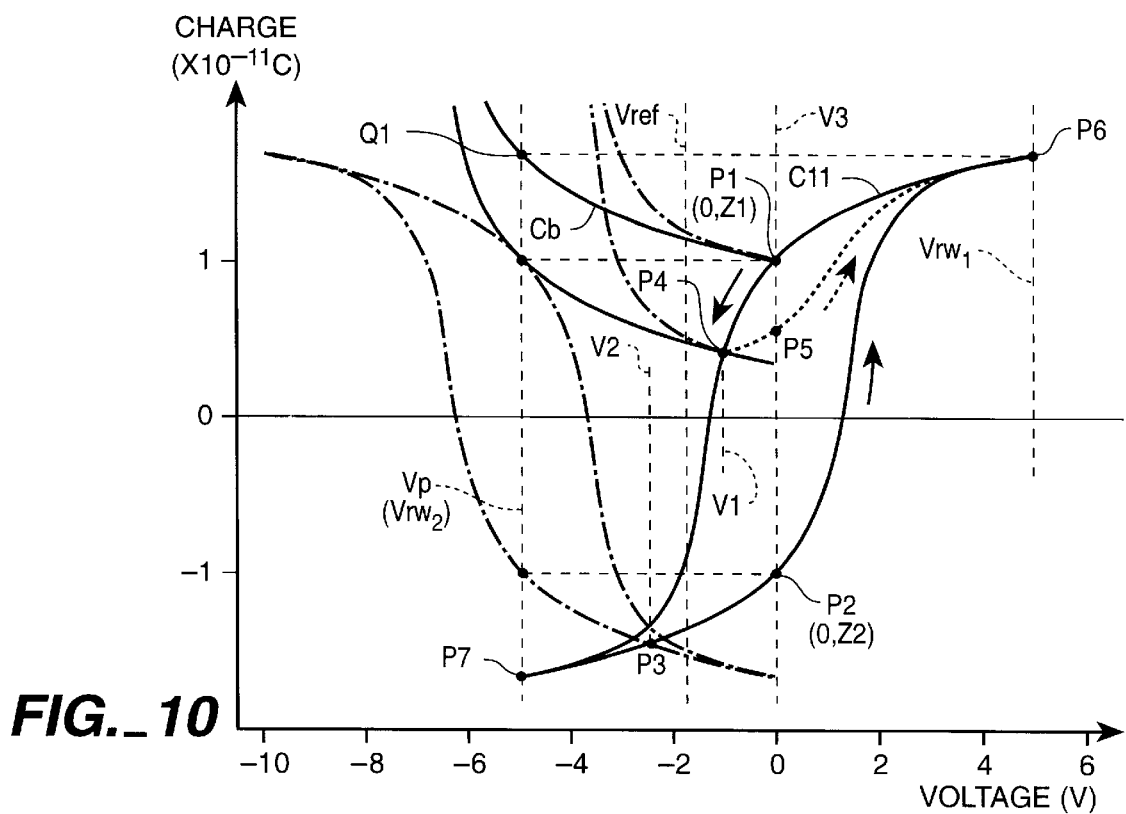
FIG._10

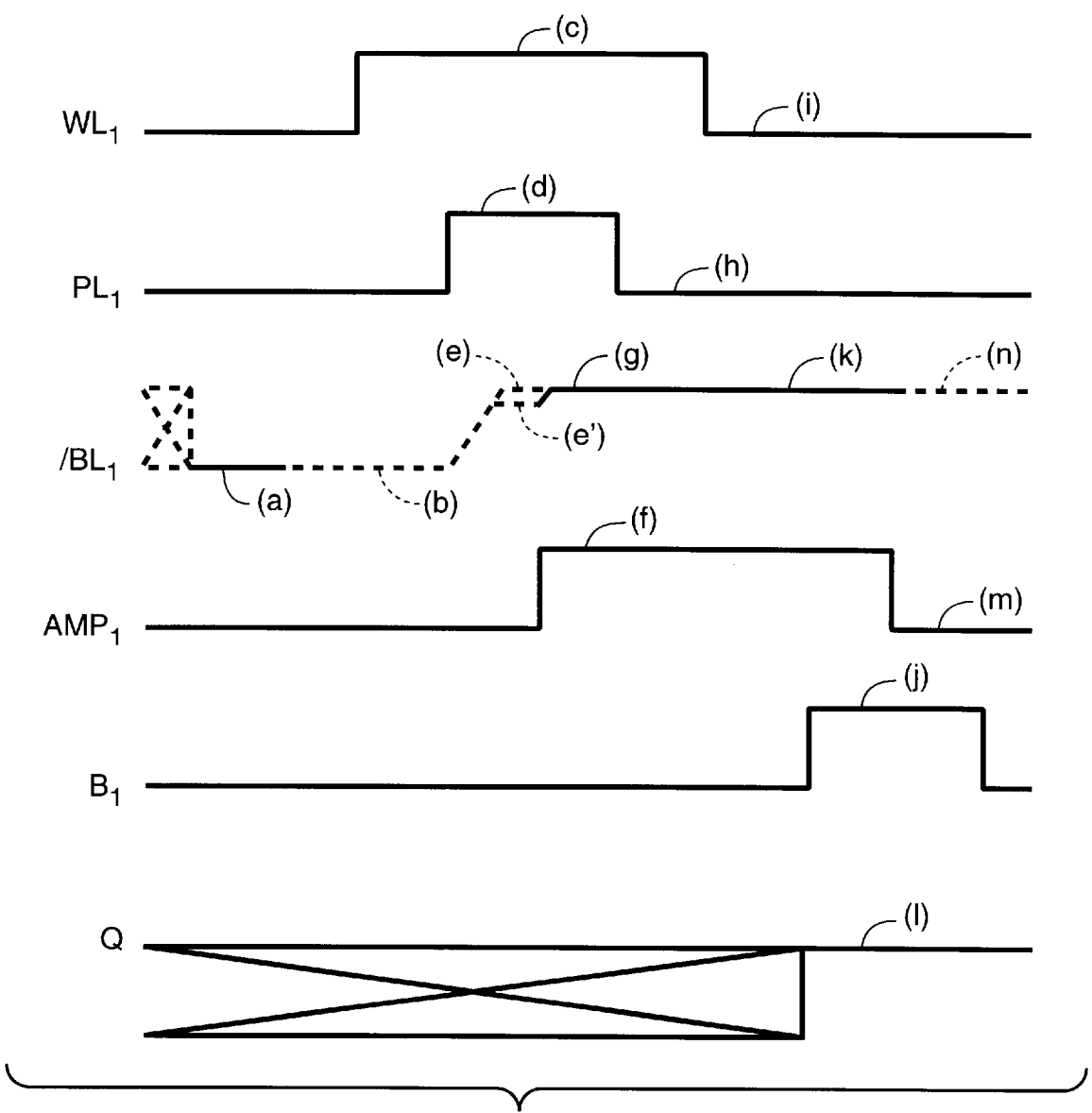
FIG._6

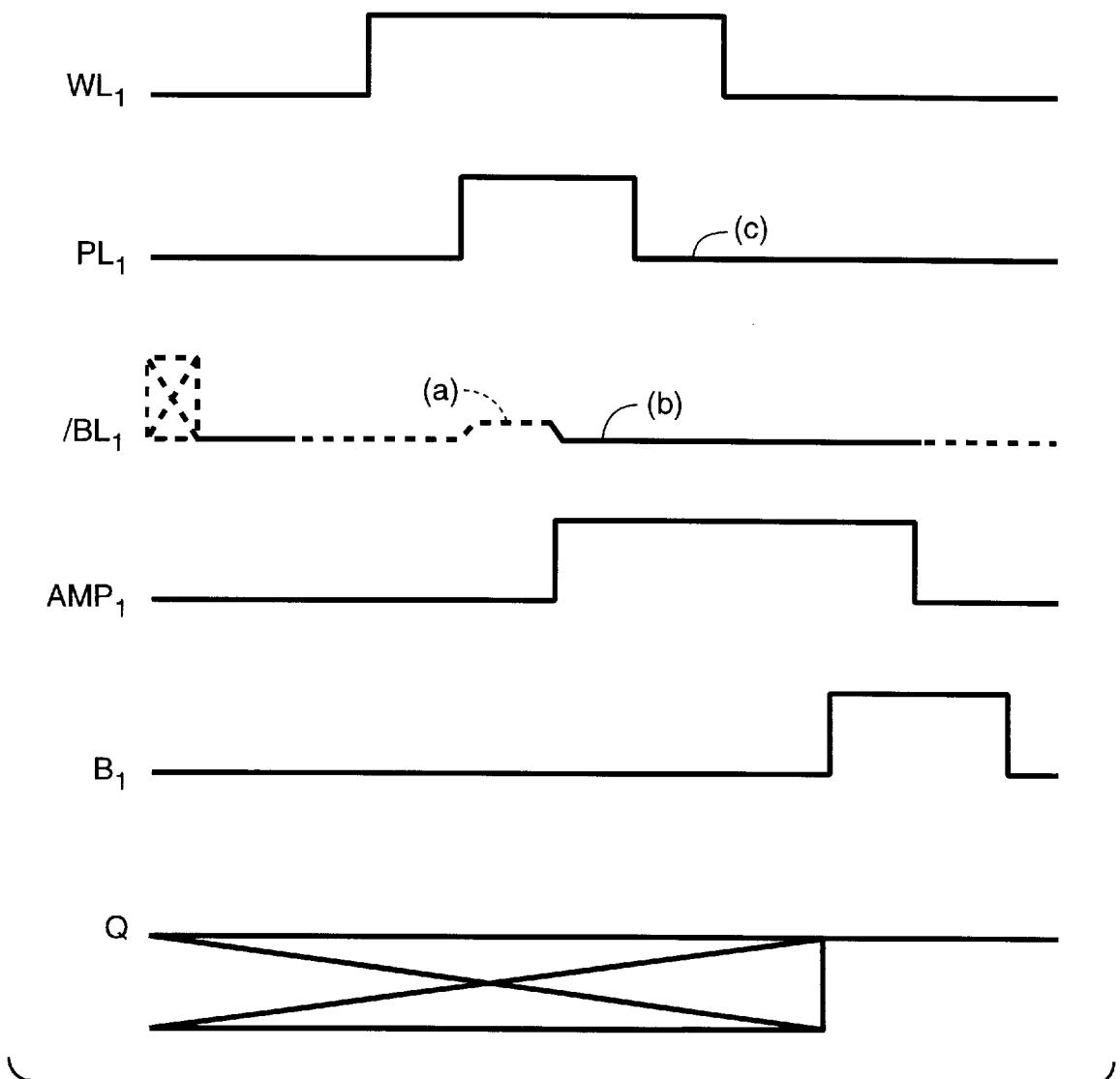
FIG._7

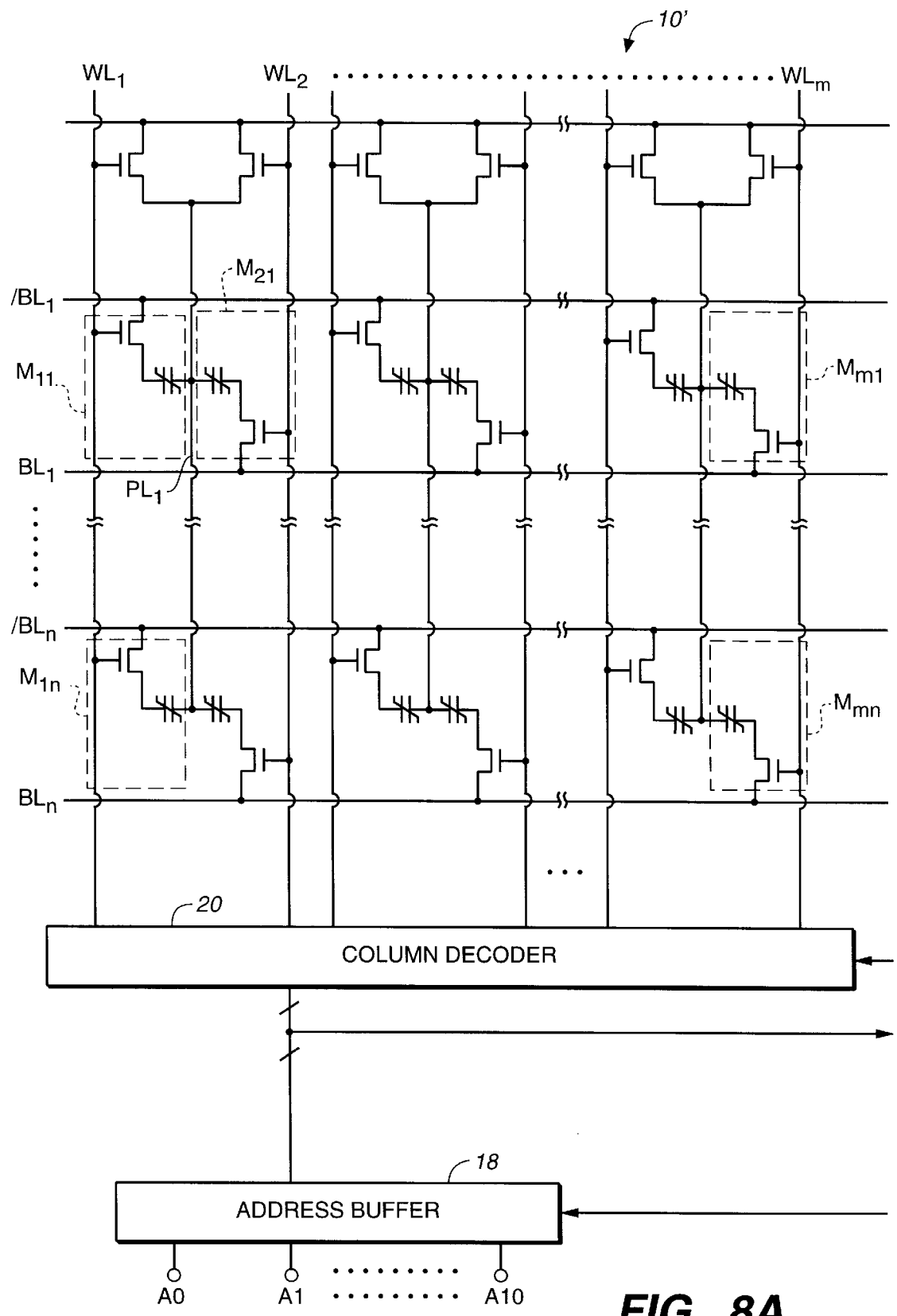
FIG._8A

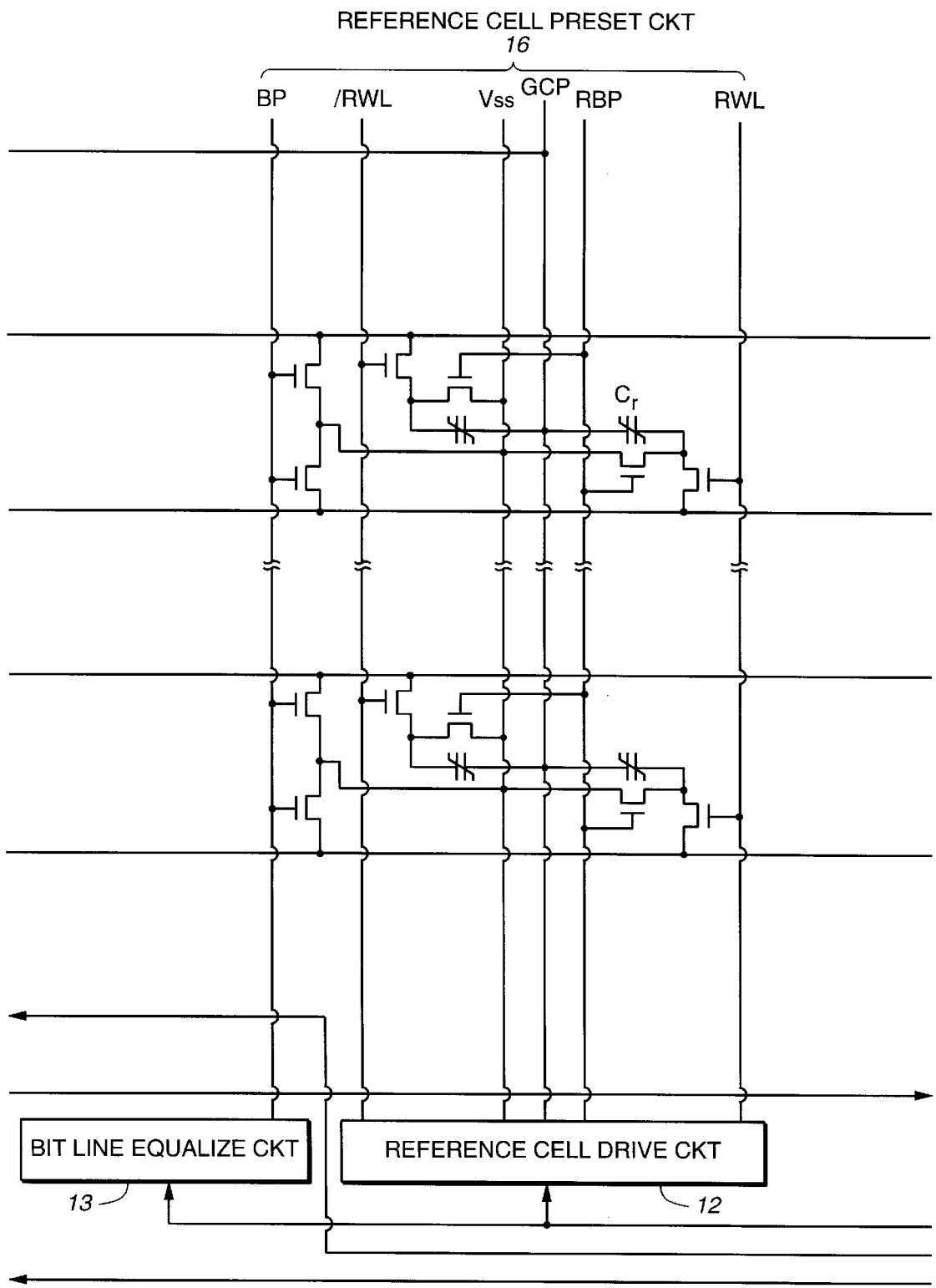
FIG._8B

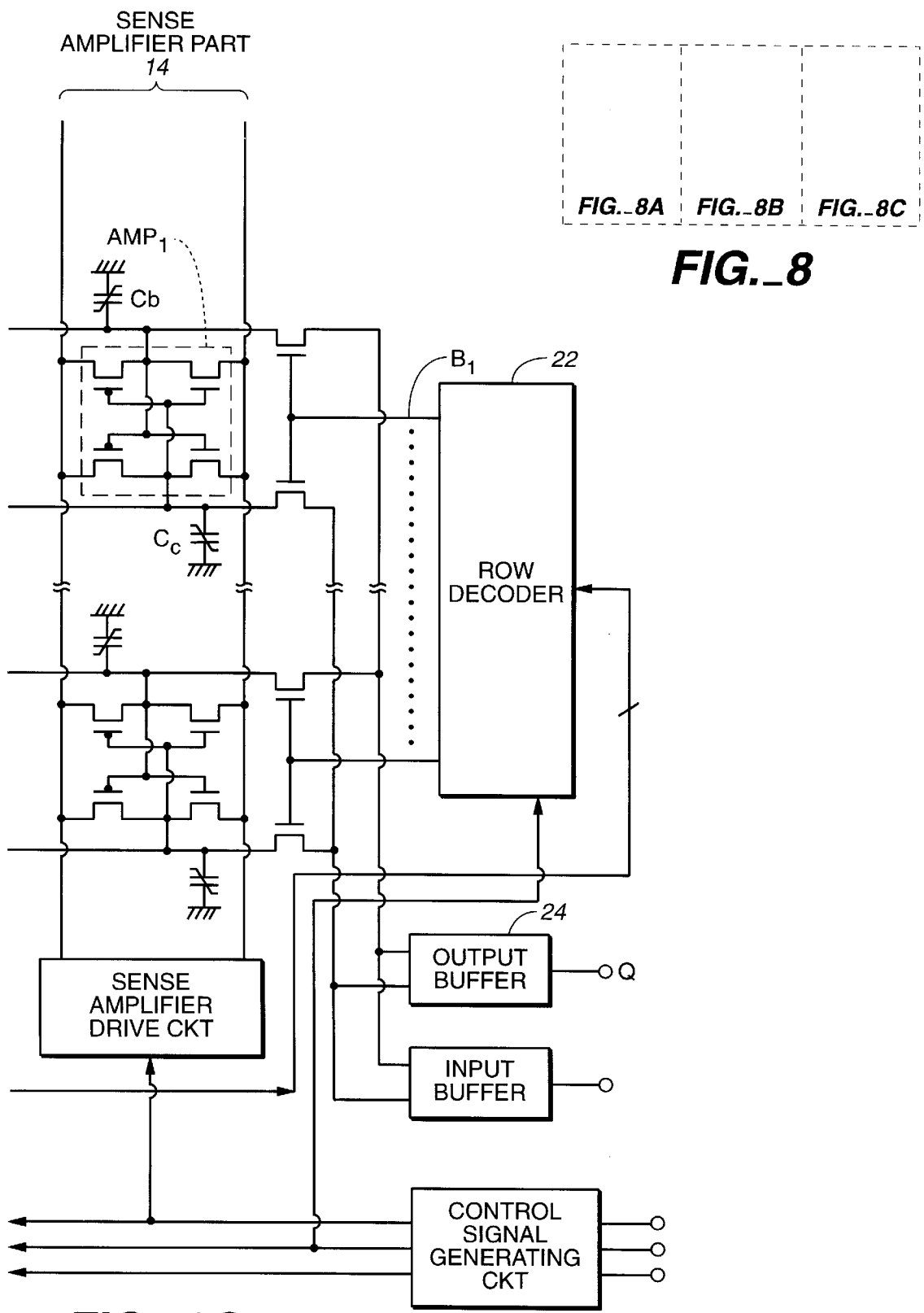
FIG._8
FIG._8C

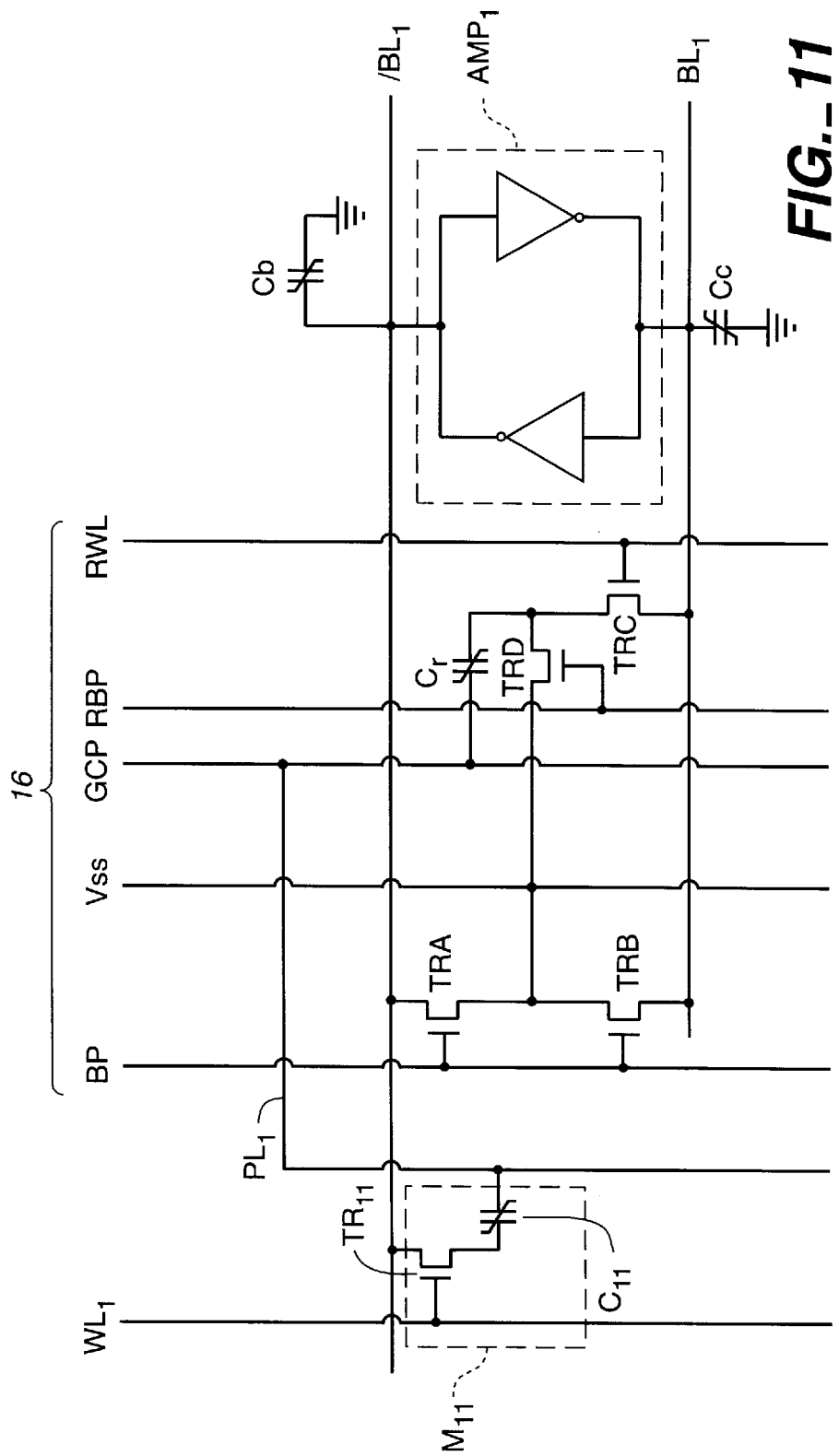
FIG._11

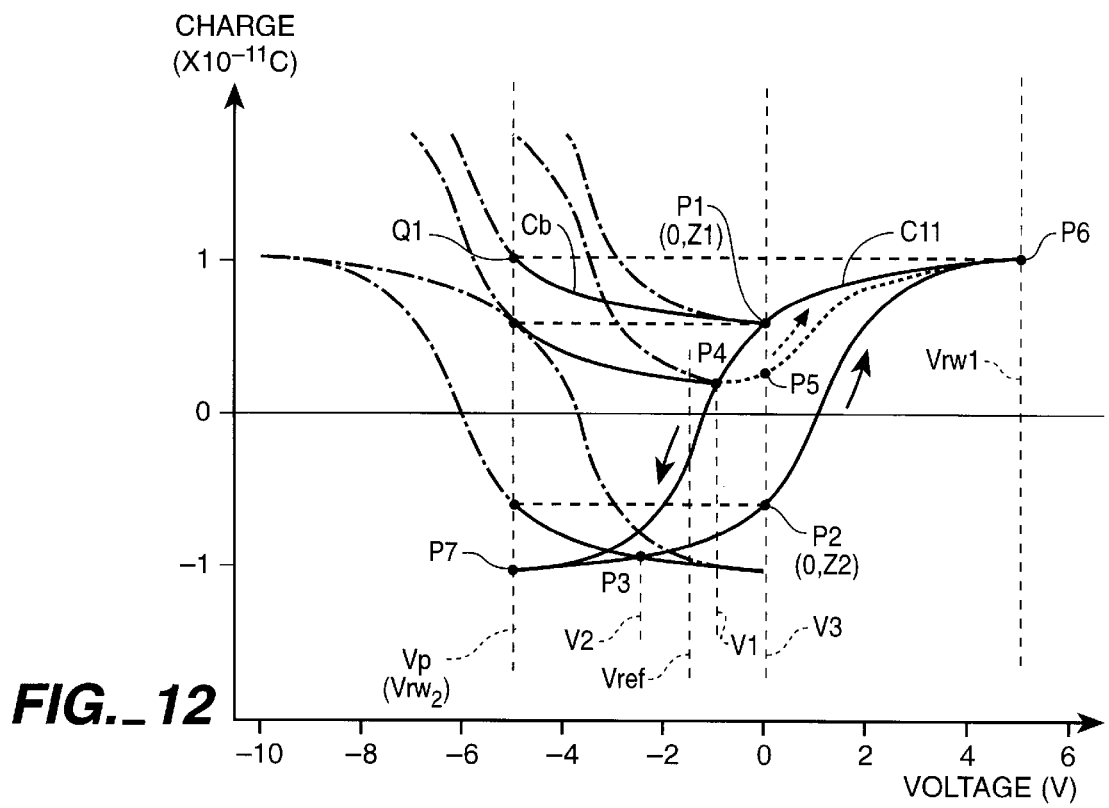
*FIG._12*
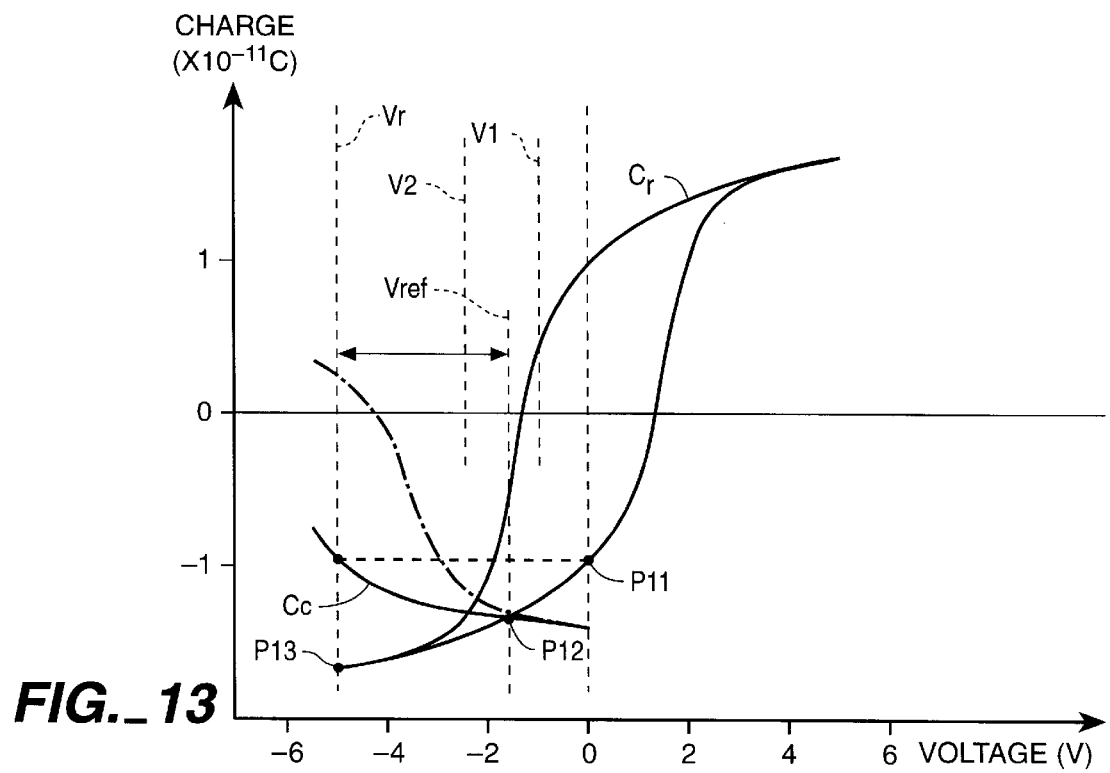
*FIG._13*

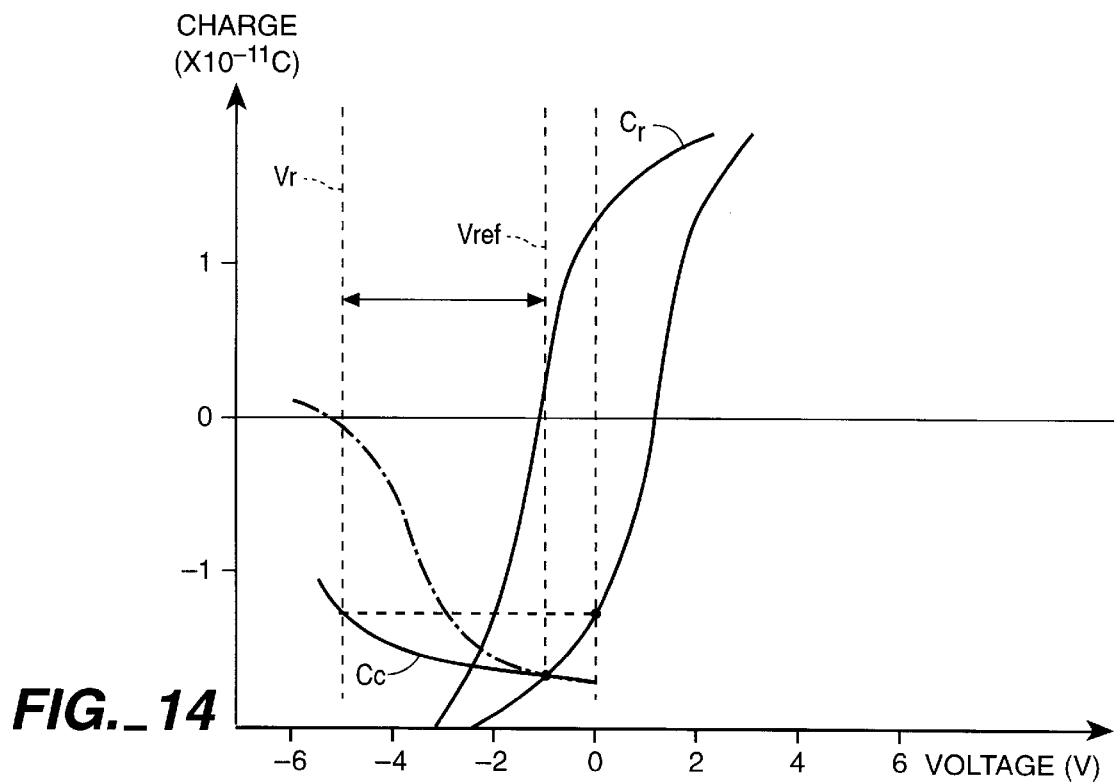
FIG._14
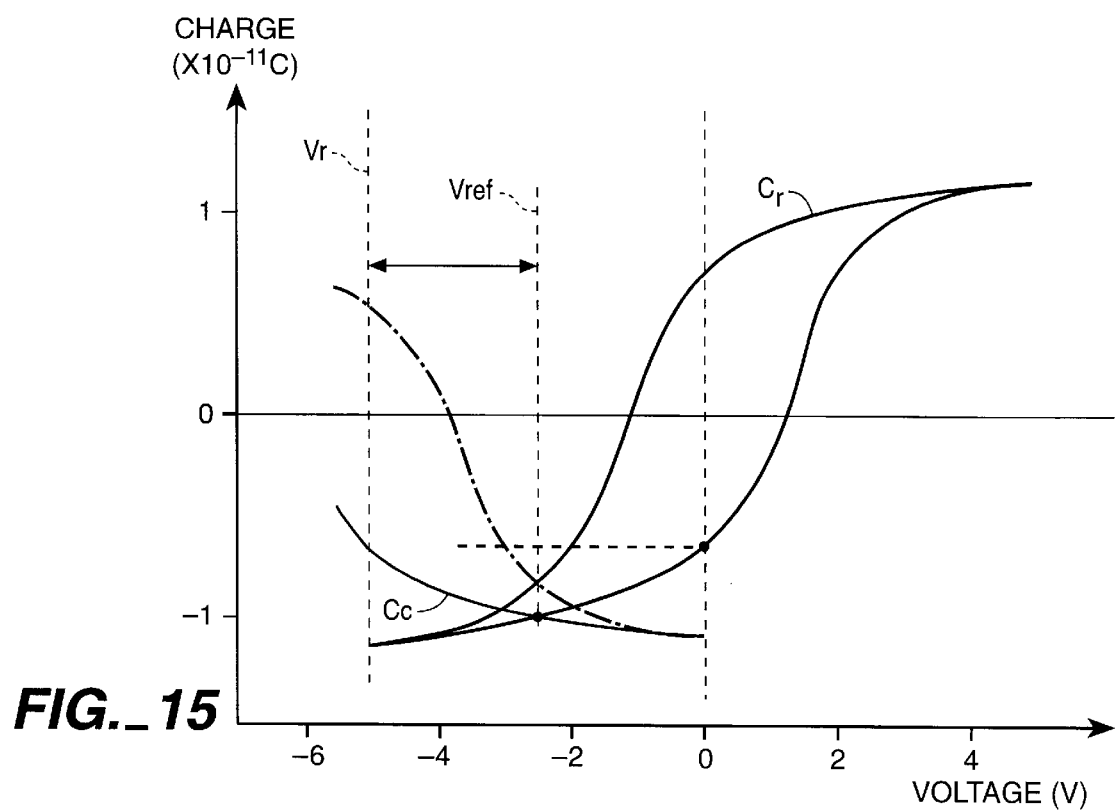
FIG._15

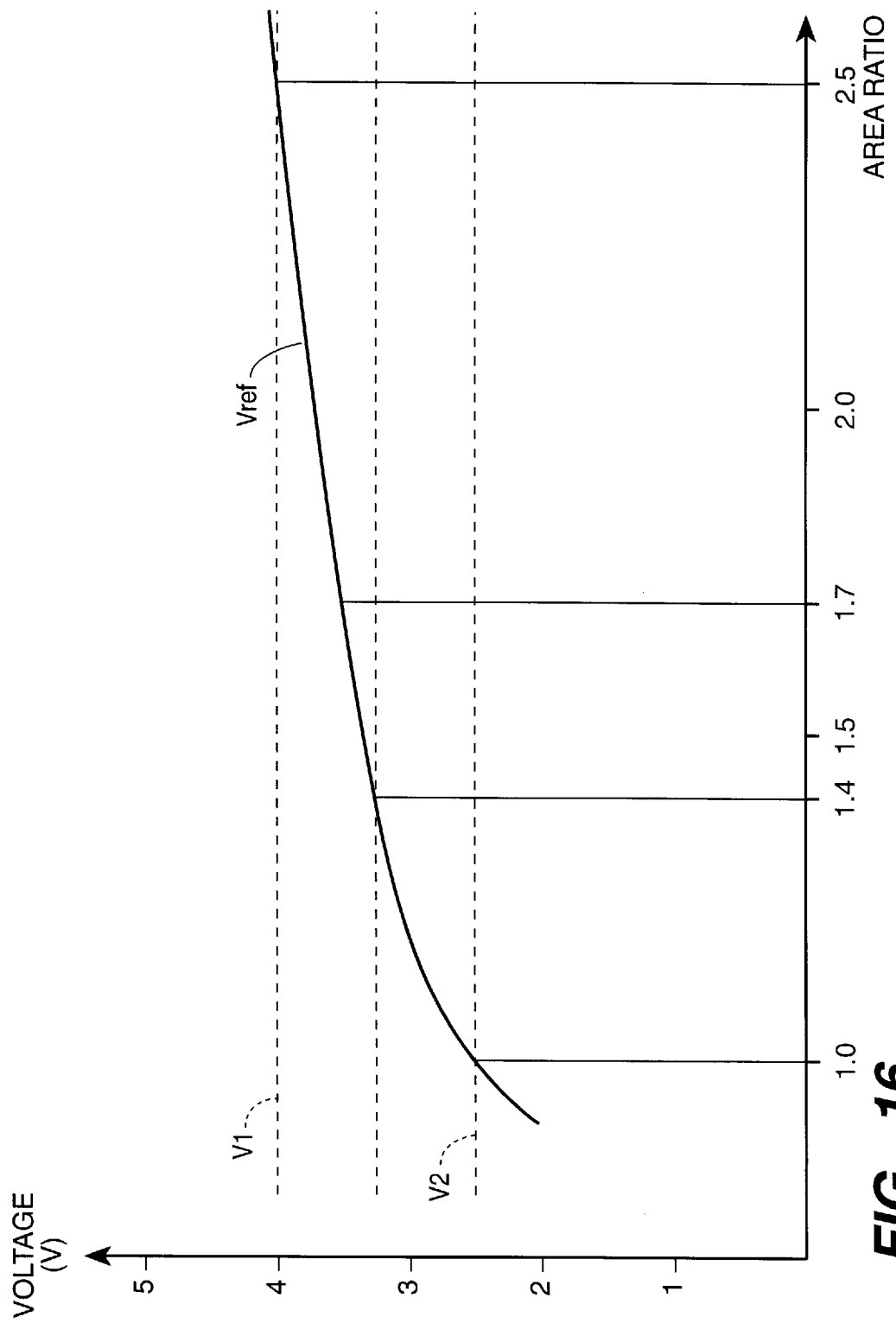
FIG._16

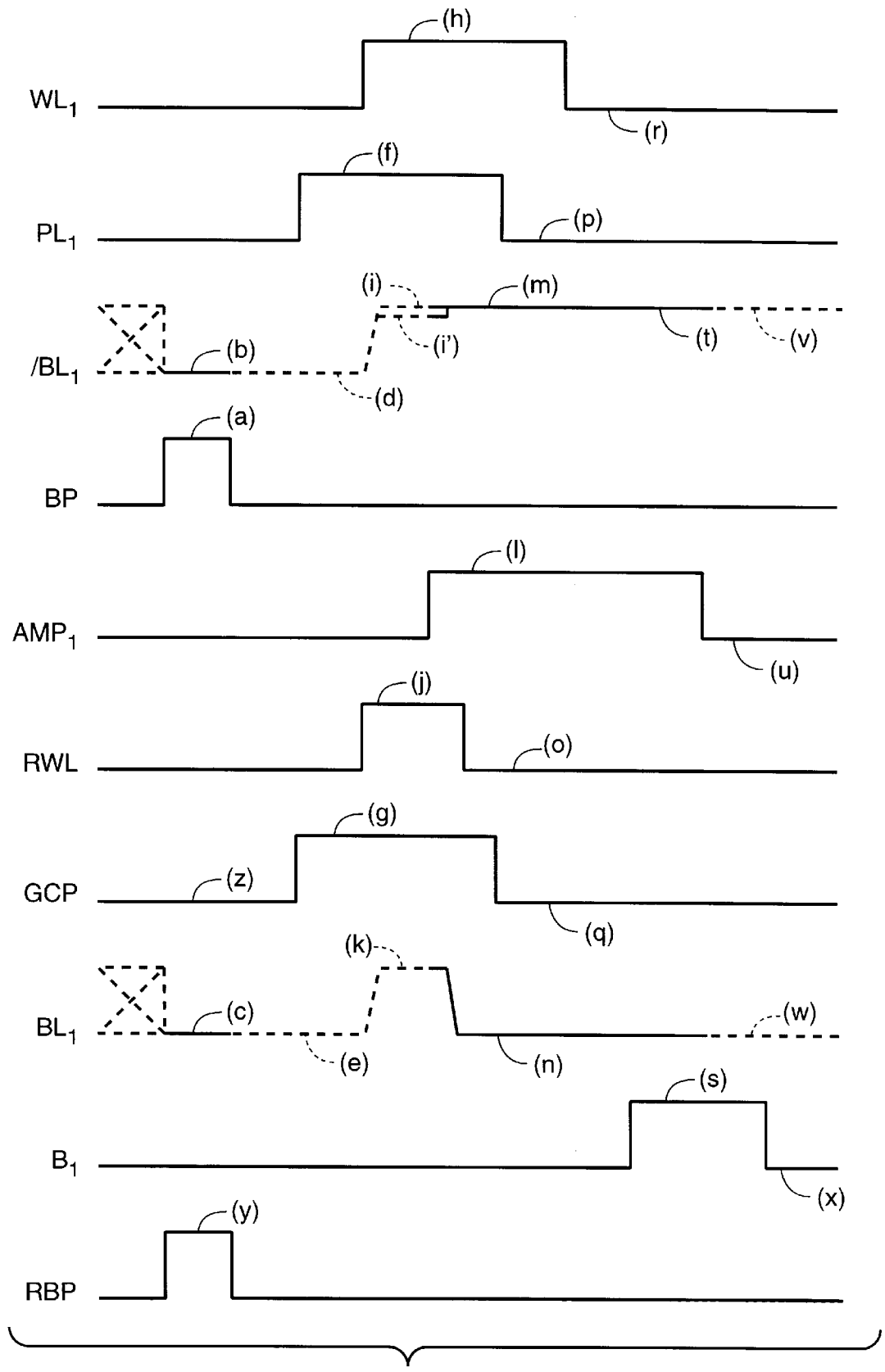
FIG._17

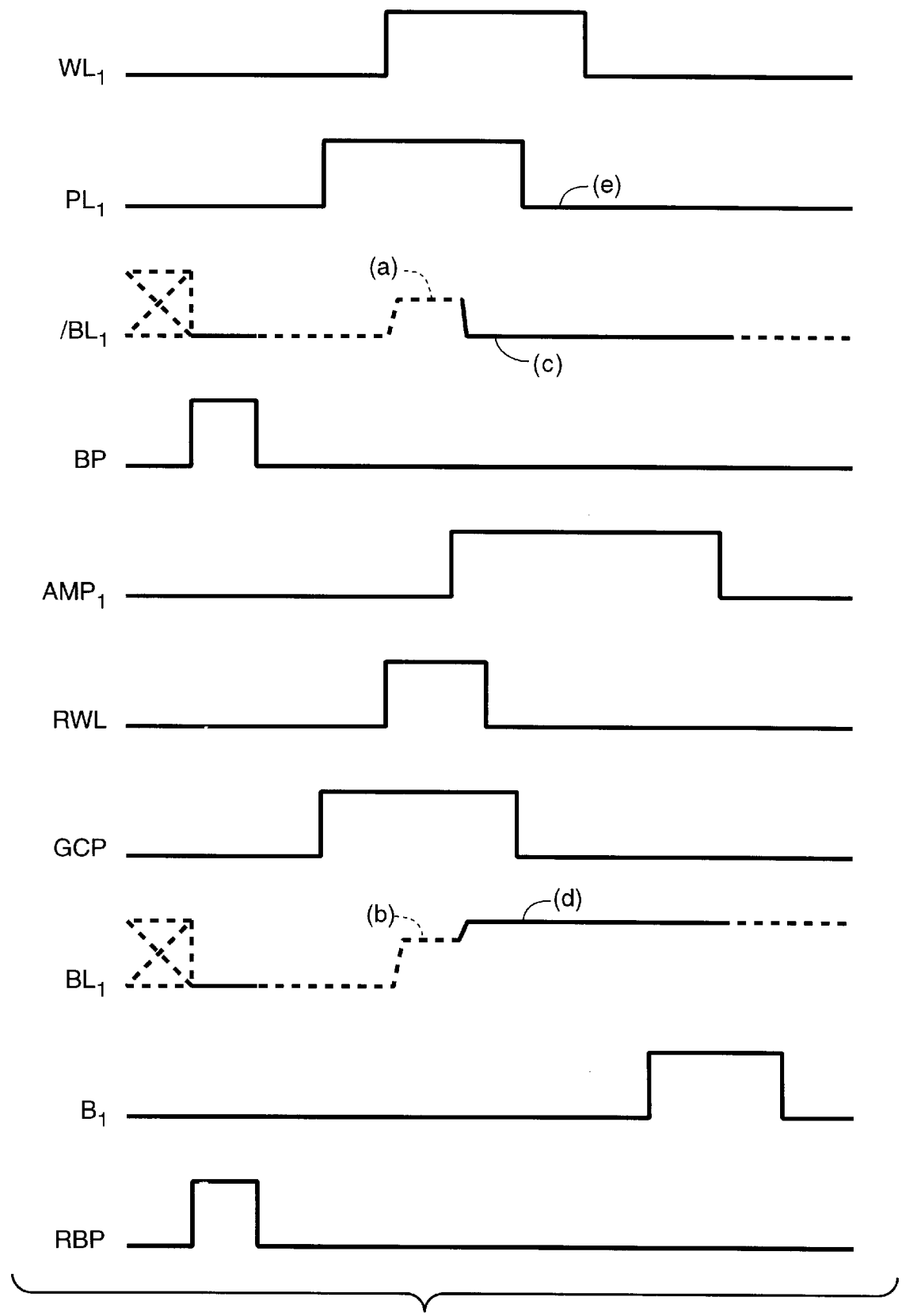
FIG._18

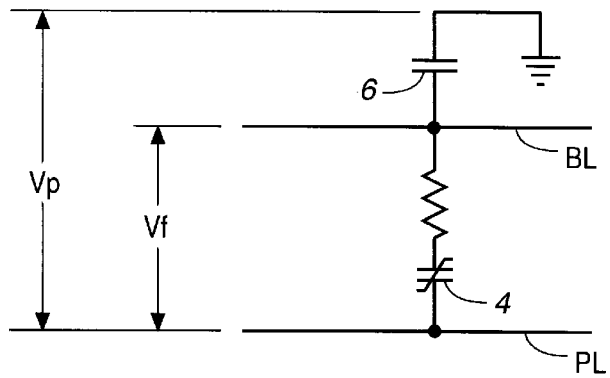
FIG._19
(PRIOR ART)
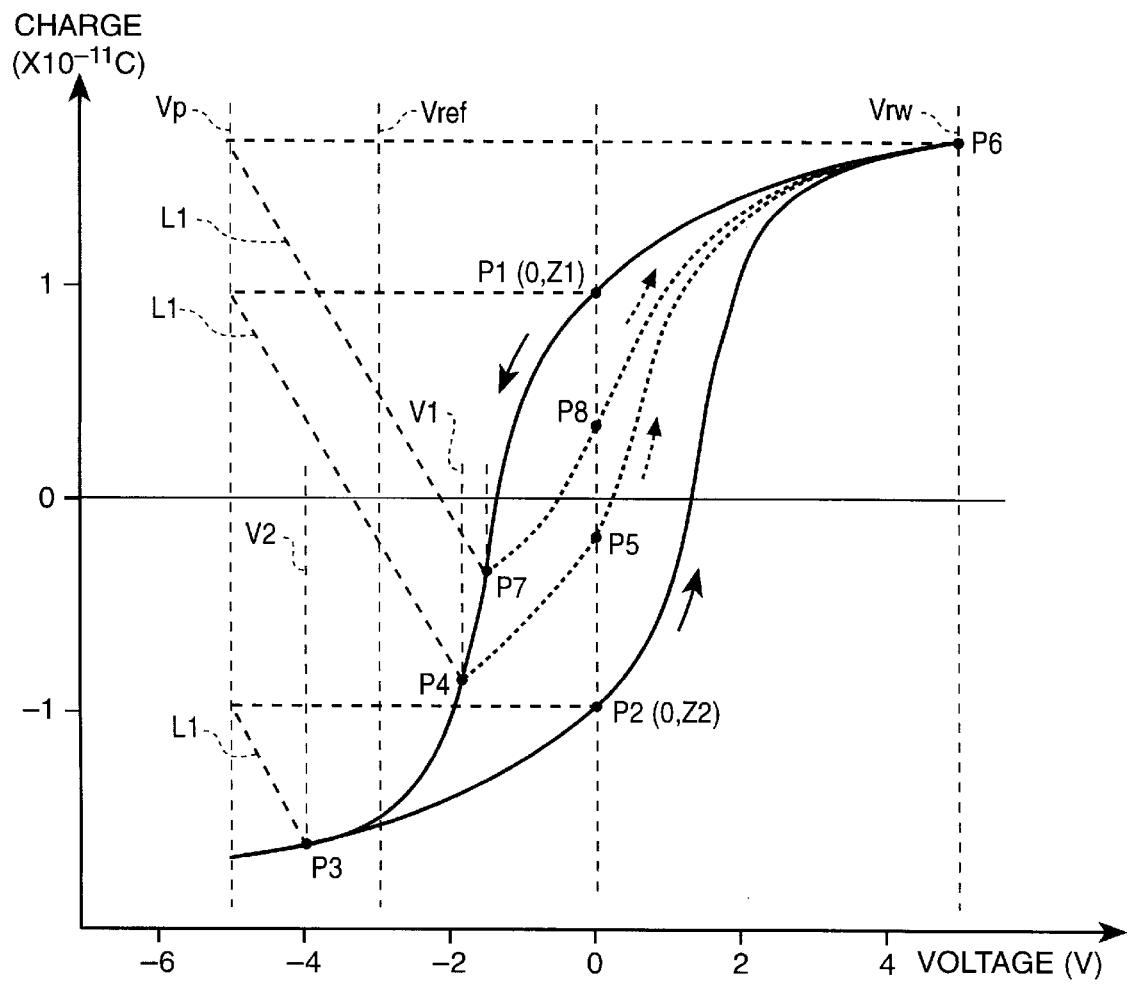
FIG._20
(PRIOR ART)

FERROELECTRIC MEMORY DEVICES AND METHODS OF USING FERROELECTRIC CAPACITORS

CROSS-REFERENCE TO RELATED APPLICATIONS

This application is a division of my commonly assigned application Ser. No. 08/749,657 filed on Nov. 15, 1996, now U.S. Pat. No. 5,764,561.

BACKGROUND OF THE INVENTION

This invention relates to ferroelectric memory devices and, more particularly, to improvements in reliability of their readout operations. This invention also relates to methods of using ferroelectric capacitors and improving the useful endurance of ferroelectric memory devices.

Ferroelectric memory devices using ferroelectric capacitors have been known as an example of non-volatile semiconductor memories. As shown in part in FIG. 19, a prior art ferroelectric memory device includes a ferroelectric capacitor 4 and a load capacitor 6, and the hysteresis curve of the ferroelectric capacitor 4, representing the relationship between the voltage (or the relative voltage of the bit line BL with respect to the plate line PL at a reference potential) and the polarization condition (represented by the "charge" which is its equivalent) is shown in FIG. 20. With reference now to FIG. 20, let first and second polarization conditions denoted by P1 and P2 respectively be the polarization condition of the ferroelectric capacitor 4 when its remanent polarization is Z1 and Z2, corresponding to memory content "H" and "L" such that the memory content of the ferroelectric capacitor 4 can be read by detecting whether the ferroelectric capacitor 4 is in polarization condition Z1 or Z2.

For determining whether the ferroelectric capacitor 4 is in the first or second polarization condition, the load capacitor 6 shown in FIG. 19 is discharged first and, after the bit line BL is in a floating condition, a readout voltage is applied to the plate line PL, and the voltage difference Vf generated between the ends of the ferroelectric capacitor 4 is measured. Let the slope of straight lines L1 in FIG. 20 represent the electrostatic capacitance of the load capacitor 6. If the ferroelectric capacitor 4 was in the first polarization condition P1, the voltage difference Vf between the ends of the ferroelectric capacitor 4 becomes V1, and if the ferroelectric capacitor 4 was in the second polarization condition P2, the voltage difference Vf will be V2. Thus, if the reference voltage Vref is set as shown in FIG. 20, it is possible to determine whether the ferroelectric capacitor 4 was in the first or second polarization condition by comparing the voltage Vf between its ends at the time of a readout and the reference voltage Vref.

In this situation, if the ferroelectric capacitor 4 is in the second polarization condition P2, there is no change in the remanent polarization although its polarization condition temporarily becomes P3 at the time of readout because the polarization condition returns to the second polarization condition P2 as the applied voltage returns to zero. If the ferroelectric capacitor 4 is in the first polarization condition P1, however, its polarization condition temporarily becomes P4 at the time of readout and then P5 as the applied voltage becomes zero, causing a change in the remanent polarization due to the readout. In view of this, a rewrite voltage Vrw is applied after the readout to the ferroelectric capacitor 4, giving rise to the polarization condition P6 such that, when the applied voltage returns to zero, the ferroelectric capacitor 4 will return to the first polarization condition. In summary, a rewrite is carried out after the readout if the ferroelectric capacitor 4 is in the first polarization condition P1 such that the remanent polarization is changed again and the ferroelectric capacitor 4 is forcibly returned to the first polarization condition P1. This has been the prior art method of preventing the change in the memory content due to the readout.

The useful endurance of a ferroelectric capacitor, however, is determined in part by the number of inversions in the spontaneous polarization (or changes in the remanent polarization) and may be about $10^{12}$ times, although this depends on the ferroelectric material. Consider now a situation of reading out the same memory cell with memory content "H" (corresponding to the first polarization condition P1). If the readout cycle is long such that the next readout is carried out only after the ferroelectric capacitor 4 returns to the first polarization condition P1 after a rewrite by natural discharge, there is no problem because the useful endurance can remain reasonably long. If the readout cycle is short such that the next readout starts before natural discharge of the ferroelectric capacitor 4 can hardly take place after a rewrite, it can be a problem from the point of view of useful endurance of the ferroelectric capacitor 4.

With reference again to FIG. 20, the voltages V1 and V2 must be set sufficiently far away from the reference voltage Vref in order to prevent errors in the readout. For this reason, the electrostatic capacitance of the load capacitor 6 (the slope of the lines L1) must be relatively large. Thus, the remanent polarization changes from P1 to P8 to P1 even when the next readout is started before there is hardly any natural discharge of the ferroelectric capacitor 4 (in polarization condition P6) after a rewrite. As a consequence, the number of times of readout from a same memory cell with memory content "H" comes to affect the useful endurance. This is one of the problems of prior art ferroelectric memory devices.

Moreover, the voltages V1 and V2 for a prior art ferroelectric memory device depend heavily on the hysteresis characteristic of its ferroelectric capacitor 4 and the electrostatic capacitance of the load capacitor 6, but there are large fluctuations in their values due, for example, to variations in the conditions at their production. Thus, the variations in voltages V1 and V2 are also large and, since the reference voltage Vref, the readout voltage Vp and the rewrite voltage Vrw themselves are not totally free from fluctuations, there may be situations where the voltage V1 becomes lower than the reference voltage Vref or where the voltage V2 becomes greater than the reference voltage Vref. In other words, errors in readout are likely to occur, adversely affecting the reliability. This is a second problem of prior art ferroelectric memory devices.

In view of the first problem described above, there has been proposed a method of using the ferroelectric capacitor 4 for an ordinary read/write in a first condition wherein the remanent polarization will not be changed and for storing the memory content in a second condition wherein changes in the remanent polarization are present (IEEE Electron Device Letters, Vol., 11, No. 10, October, 1990). This method may be effective against the problem regarding the useful endurance of the ferroelectric capacitor, but it is not capable of improving the reliability by preventing errors in readout. Moreover, this method requires two process algorithms for the two conditions, making the process complicated. It further requires a judging circuit for making a choice between the first and second conditions, and the transition into the second condition in the case of the occurrence of an abnormal condition may not take place sufficiently quickly. In summary, this method has problems also from the point of view of protecting stored data.

SUMMARY OF THE INVENTION

It is therefore an object of this invention to overcome the problems of prior art ferroelectric memory devices using ferroelectric capacitors by providing improved ferroelectric memory devices having a simple structure and an improved useful endurance, which are reliable regarding readout and other operations and protection of stored data, as well as methods of storing data by using an improved ferroelectric memory device.

A ferroelectric memory device embodying this invention, with which the above and other objects can be accomplished, may be characterized as comprising a ferroelectric memory capacitor, a load capacitor, a readout voltage applying means, a memory content judging means and a rewriting means. The ferroelectric memory capacitor has a hysteresis characteristic which defines a relationship between applied voltage and polarization condition and is adapted to store selectively, based on its hysteresis characteristic, either a first memory content corresponding to a first polarization condition or a second memory content corresponding to a second polarization condition when there is no applied voltage. The load capacitor is adapted to become electrically connected in series with the memory capacitor at least at a readout time at which the content of the memory capacitor is read out. The readout voltage applying means is for applying a readout voltage to the series connection of the memory capacitor and the load capacitor when the content of the memory capacitor is read out, or at the readout time. The readout voltage is characterized as having a polarity which is different from the polarity of the voltage which will result in the first polarization condition. The memory content judging means is for judging whether the first memory content or the second memory content is stored in the memory capacitor, and this is done on the basis of the partial voltage generated across the memory capacitor when the readout voltage is applied to it. The rewriting means is for applying a rewrite voltage to the memory capacitor for recovering the polarization condition corresponding to the memory content judged by the memory content judging means. The readout voltage, the rewrite voltage to be applied for recovering the first polarization condition (referred to herein as the first rewrite voltage), the hysteresis characteristic of the memory capacitor and the characteristics of the load capacitor are adjusted such that the voltage across the memory capacitor, when the content of the memory capacitor is read out while the memory capacitor is in a fully charged polarization condition by the first rewrite voltage for recovering the first polarization condition, is zero or of the same polarity as the first rewrite voltage.

According to another embodiment of the invention, a ferroelectric capacitor having approximately the same characteristics as the memory capacitor is used as the load capacitor, and the absolute value of the readout voltage is adjusted to be smaller than or approximately the same as the absolute value of the first rewrite voltage for recovering the first polarization condition.

At the time of a fast readout wherein the next readout takes place immediately after a rewrite, the ferroelectric memory capacitor does not change its polarization condition from the first to the second, or there is no change in the remanent polarization, and the useful endurance of the memory capacitor is not adversely affected.

Because the memory content is kept as remanent polarization, independently of whether it is a high-speed or low-speed readout, there is no need for processes for saving or recalling a memory content. Neither is there any need for means for detecting a power shutdown because the memory content is not lost by a power shutdown. In summary, the present invention provides a memory device with a simple structure capable of reliably storing memory contents and having an extended useful endurance.

Still another ferroelectric memory device according to this invention may be characterized as comprising, in addition to a ferroelectric memory capacitor as described above, a ferroelectric reference capacitor, a first load capacitor which is electrically connected in series with the memory capacitor, and a second load capacitor which is electrically connected in series with the reference capacitor. Both of these load capacitors are a ferroelectric capacitor having substantially the same characteristics as the memory capacitor. Let Vref denote the partial voltage which appears across the reference capacitor if a specified voltage is applied to the series connection of the reference capacitor and the second load capacitor, and let V1 and V2 be respectively the partial voltage which appears across the memory capacitor if the same specified voltage is applied to the series connection of the memory capacitor and the first load capacitor when the memory capacitor is in the first or second polarization condition. According to this invention, the ratio of area between the reference capacitor and the second load capacitor is such that Vref is nearly equal to the average of V1 and V2 or slightly closer to V1 from this average.

With a memory device thus structured, the values of the partial voltages V1 and V2 are stable because the memory capacitor, the reference capacitor and the two load capacitors have substantially the same characteristics. Since the capacitor areas are so adjusted that Vref is nearly equal to the average of V1 and V2 or slightly closer to V1 from this average, the device has a large margin or error in detecting the memory content. Variations in Vref corresponding to variations in the area ratio are smaller if Vref is closer to V1. Thus, the invention provides an improved reliability associated with the readout.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a portion of a circuit diagram of a ferroelectric memory device according to a first embodiment of this invention using ferroelectric capacitors;

FIG. 2 is an enlarged circuit diagram of a portion of FIG. 1;

FIG. 3 shows the hysteresis characteristic of the memory capacitor C11 of FIG. 2;

FIG. 4 is a hysteresis curve of a ferroelectric capacitor used in a memory device embodying this invention;

FIG. 5 is a hysteresis curve of another ferroelectric capacitor which may be used in a memory device of this invention;

FIG. 6 is a timing chart for the operation of the memory device of FIG. 1 for reading out memory "H";

FIG. 7 is a timing chart for the operation of the memory device of FIG. 1 for reading out memory "L";

FIG. 8 is a portion of a circuit diagram of ferroelectric memory devices according to second and third embodiments of this invention;

FIG. 9 is a portion of the circuit diagram of FIG. 8 according to the second embodiment of this invention;

FIG. 10 shows the hysteresis characteristic of the memory capacitor C11 incorporated in the memory device according to the second embodiment of the invention;

FIG. 11 is a portion of the circuit diagram of FIG. 8 according to the third embodiment of the invention;

FIG. 12 shows the hysteresis characteristic of the memory capacitor C11 of FIG. 11;

FIG. 13 shows hysteresis characteristics of the capacitors Ce and Cr of FIG. 11;

FIGS. 14 and 15 show hysteresis characteristics of the capacitors Ce and Cr as the ratio of their areas is changed;

FIG. 16 is a graph for showing the relationship between the area ratio of capacitors used in the memory device according to the third embodiment of this invention and reference voltage;

FIG. 17 is a timing chart for the operation of the memory device according to the third embodiment of this invention for reading out memory "H";

FIG. 18 is a timing chart for the operation of the memory device according to the third embodiment of this invention for reading out memory "L";

FIG. 19 is a circuit diagram of a portion of prior art ferroelectric memory device; and FIG. 20 is a hysteresis curve for showing the operation of a ferroelectric capacitor used in a prior art memory device.

Throughout herein, components which are equivalent to each other, although being parts of different devices, are indicated by the same numerals/symbols.

DETAILED DESCRIPTION OF THE INVENTION

FIG. 1 is a portion of a circuit diagram of a ferroelectric memory device 10 (hereinafter referred to simply as "the memory device") using ferroelectric capacitors according to a first embodiment of this invention. The memory device 10 has a plurality of memory cells M11, M21, . . . Mmn in a matrix formation with rows and columns. In FIG. 1, the vertical arrays M11 . . . M1n and the horizontal arrays M11 . . . Mm1 are respectively referred to as columns and rows. The memory device 10 also includes a reference cell drive circuit 12, a sense amplifier section 14 having sense amplifiers AMP1, . . . and a reference cell preset circuit 16. The reference cell driving circuit 12 may also be referred to as the readout voltage applying means. The sense amplifier section 14 and the reference cell preset circuit 16 may also be referred to as the memory content judging means. The reference cell driving means 12 and the sense amplifier section 14 may also be referred to as the rewrite means. It is to be noted that the reference cell drive circuit 12 is used both in the readout voltage applying means and the rewrite means, that the sense amplifier section 14 is used both in the memory content judging means and the rewrite means, and hence that the circuit structure of this memory device 10 is simplified according to this embodiment.

As shown in FIG. 2 which describes more in detail a portion of FIG. 1 according to the first embodiment of this invention, the memory cell M11 comprises a memory capacitor C11 serving as memory means (for storing data) and a selection transistor TR11. One end of the memory capacitor C11 is electrically connected in series with a load capacitor Cb through the selection transistor TR11 and bit line /BL1. It is to be noted that the load capacitor Cb, in this example, is a paraelectric capacitor given as a parasitic capacitance between the bit line /BL1 and the ground. The other end of the memory capacitor C11 is connected to the reference cell drive circuit 12 (shown in FIG. 1) through plate line PL1. The gate of the selection transistor TR11 is connected to word line WL1. One end of sense amplifier AMP1 is connected to bit line /BL1, the other end of sense amplifier AMP1 being connected to the reference cell preset circuit 16 through plate line PL1.

FIG. 3 shows the hysteresis characteristic of the memory capacitor C11, that is, the relationship between its voltage and polarization condition. The voltage is represented by that of the bit line /BL1 with the plate line PL1 at reference voltage. The polarization condition is represented by the charge, which is its equivalent. With reference to FIG. 3, the condition with remanent polarization Z1 is referred to as the first polarization condition P1 (corresponding to a first memory content "H"), and the condition with remanent polarization Z2 is referred to as the second polarization condition P2 (corresponding to a second memory content "L").

The electrostatic capacitance of the load capacitor Cb shown in FIG. 2 is determined as follows. In FIG. 3, let Q1 be the point where the horizontal line indicating the polarization condition P6 (corresponding to the first rewrite voltage Vrw1, to be described below) crosses the vertical line indicating the readout voltage Vp (to be described below). Consider a straight line which connects Q1 with the point P1, representing the first polarization condition on the hysteresis curve. The slope of this straight line represents the electrostatic capacitance of the load capacitor Cb. As will be explained below, the remanent polarization will hardly change when a memory content "H" is read out at a high speed if use is made of a load capacitor Cb with such capacitance, and adverse effects on the useful endurance can be prevented.

FIG. 4 shows the hysteresis H of the memory capacitor C11 in the circuit of FIG. 2. This may be considered as the synthesis of a ferroelectric term Hf having a hysteresis characteristic and a paraelectric term Hp having no hysteresis characteristic. Let R6 be the polarization condition based on the ferroelectric term Hf in the condition P6 when it is fully charged by a (first) rewrite voltage Vrw1 and R1 be the polarization condition based on the ferroelectric term Hf in a first polarization condition P1. The hysteresis of the memory capacitor C11 is so determined that the polarization conditions R6 and R1 are approximately the same. In other words, the memory capacitor C11 has a high susceptibility, that is, the ferroelectric term Hf has a steep rise. If a ferroelectric capacitor with such a hysteresis characteristic is used, there is hardly any variation in the polarization condition due to the ferroelectric term Hf when the memory content "H" is read out at a fast rate, as will be explained below. This serves to prevent the shortening of the useful endurance.

If a ferroelectric capacitor with low susceptibility, as shown by FIG. 5, is used, the difference (indicated by "d") between the polarization conditions R6 and R1 becomes larger. If memory contents "H" are read out at a fast rate by using a ferroelectric capacitor having such a hysteresis characteristic, the change in the polarization condition due to the ferroelectric term Hf is large, and this affects the useful endurance adversely. In summary, it is preferred that the polarization condition R1 be at least greater than 80% of the polarization condition R6.

Next, the operations for reading out a stored content from the memory device 10 will be explained with reference to FIGS. 1, 2, 3 and 6. For reading out the content of memory cell M11, for example, the corresponding address is inputted to the address buffer 18 shown in FIG. 1, thereby selecting the target memory cell M11 through the column decoder 20 for selecting a column and the row decoder 22 for selecting a row. Let us assume first that the memory capacitor C11 (of the memory cell M11) is in the polarization condition P6 of FIG. 6 (that is, fully charged at first rewrite voltage Vrw1) when the (high-speed) readout takes place. In this situation, the voltage on the bit line /BL1 shown in FIG. 2 is switched to "L" to thereby discharge the load capacitor Cb (as shown in FIG. 6 at (a)), and the bit line BL1 is then set in a floating condition (as shown in FIG. 6 at (b)). Next, the word line WL1 is set to "H" to thereby set the selection transistor TR11 in the ON condition (as shown in FIG. 6 at (c)), and then the plate line PL1 is set to "H" (as shown in FIG. 6 at (d)) according to an output from the reference cell drive circuit 12 (shown in FIG. 1). As the plate line PL1 is set to "H", a readout voltage Vp is applied to both ends of the memory capacitor C11 and the load capacitor Cb, thereby causing a partial voltage V3 to be generated at the memory capacitor C11 as shown in FIG. 3. By analyzing on the graph, it is obtained that the partial voltage V3 is given as the voltage on the memory capacitor C11 at the first polarization condition P1, or V3=0. In other words, the potential of the bit line /BL1 with the ground as reference is of the value shown in FIG. 6 at (e).

Next, the sense amplifier AMP1 is activated (as shown in FIG. 6 at (f)). The sense amplifier AMP1 compares the reference voltage Vref (or threshold voltage) shown in FIG. 3 provided from the reference cell preset circuit 16 (shown in FIG. 1) through the bit line BL1 with the partial voltage V3 of the memory capacitor C11 (although, in reality, the comparison is made between the potential of the reference voltage Vref with respect to the readout voltage Vp shown in FIG. 3 with the partial voltage V3). If the partial voltage V3 is higher, it is concluded that the memory content is "H" and the voltage of the bit line /BL1 is set to "H" (as shown in FIG. 6 at (g)). The polarization condition of the memory capacitor C11 at this moment is P1. The reference voltage Vref is set between partial voltages V1 and V2, as will be explained below.

Next, the plate line PL1 is set to "L" in response to an output from the reference cell drive circuit 12 shown in FIG. 1 (as shown in FIG. 6 at (h)), causing a voltage difference between the plate line PL1 and the bit line /BL1 which is maintained at "H". This voltage difference serves as the first rewrite voltage Vrw1 shown in FIG. 3 applied to the memory capacitor C11. The polarization condition of the memory capacitor C11 is now P6 shown in FIG. 3, which is the fully charged condition.

Next, the word line WL1 is dropped to "L" (as shown in FIG. 6 at (i)) while the memory capacitor C11 is in the fully charged condition by the first rewrite voltage Vrw1 such that the selection transistor TR11 is switched to the OFF condition and the memory capacitor C11 is set in a floating condition. Next, the output line B1 of the row decoder 22 (shown in FIG. 1) is raised (as shown in FIG. 6 at (j)) such that the voltage level "H" of the bit line /BL1 (shown in FIG. 6 at (k)) is taken into the output buffer 24 (as shown in FIG. 6 at (l)). The sense amplifier AMP1 is thereafter set to OFF condition (as shown in FIG. 6 at (m)) such that the bit line /BL1 is again set in a floating condition (as shown in FIG. 6 at (n)). Finally, the output line B1 of the row decoder 22 is returned to "L" and the readout process is completed.

In the case of such a high-speed readout, that is, in the case of a readout with a short cycle such that the next readout takes place after the memory capacitor C11 is fully charged by the first rewrite voltage Vrw1 but before it is discharged, the polarization condition of the memory capacitor C11 changes only from P6 to P1 to P6 during the course of the process as described above. As a result, the remanent polarization of the memory capacitor C11 remains at the first polarization condition P1 and does not change. In other words, the useful endurance of the memory capacitor C11 is not adversely affected by the change in remanent polarization at the time of a high-speed readout. As shown in FIG. 4, furthermore, there is hardly any change in the polarization condition due to the ferroelectric term Hf during the course of changes in the polarization condition of the memory capacitor C11 from P6 to P1 to P6. According to this embodiment of the invention, therefore, neither is there hardly any adverse effect on the useful endurance of the memory capacitor C11 due to the changes in polarization condition based on the ferroelectric terms Hf.

Next will be explained the operations at the time of readout at a long cycle, that is, when the (low-speed) readout is carried out when the paraelectric term Hp (shown in FIG. 4) is completely discharged, that is, at the first polarization condition P1 shown in FIG. 3.

The memory device 10 according to this embodiment of the invention carries out readouts entirely in the same ways, without distinguishing between high-speed and low-speed readouts. In other words, a low-speed readout is carried out in the same way as the high-speed readout. In the case of a low-speed readout, however, it is different in that the readout takes place when the polarization condition is P1, as shown in FIG. 3, not P6 as in the case of a high-speed readout. Thus, the polarization condition of the memory capacitor C11 is P4 when a readout voltage Vp is applied as shown in FIG. 3 in the case of a slow-speed readout, and the partial voltage generated at the memory capacitor C11 is V1 . The voltage of the bit line /BL1 with respect to the ground at this moment is as shown in FIG. 6 at (e'). Since the reference voltage Vref is set to be lower than V1 , as explained above, the sense amplifier AMP1 concludes that the memory content is "H" as in the case of a high-speed readout and sets the potential of the bit line /BL1 to be "H" (as shown in FIG. 6 at (g)). The polarization condition of the memory capacitor C11 at this moment is P5, as shown in FIG. 3.

A rewrite is thereafter carried out by applying the first rewrite voltage Vrw1 (as shown in FIG. 6 at (h)) to the memory capacitor C11. The polarization condition of the memory capacitor C11 becomes P6 by this rewrite. After the readout operations, the charges based on the paraelectric term Hp (shown in FIG. 4) of the memory capacitor C11 are completely discharged as time elapses, and the polarization condition returns to P1.

In summary, the remanent polarization changes from P1 to P5 to P1 in the case of a low-speed readout, and as the polarization condition of the memory capacitor C11 changes from P1 to P4, as shown in FIG. 4, the polarization condition based on the ferroelectric term Hf also changes from R1 to R4. Thus, the useful endurance of the memory capacitor C11 will be adversely affected when the memory content "H" is read out at a low speed. When the readout is at a low speed, however, the number of readout operations per unit time is small, and since the effect on the useful endurance per unit time is also small, this does not amount to a serious problem.

Next will be explained the operations for reading out a memory content "L" with reference to the timing chart in FIG. 7. As can be understood by comparing FIGS. 6 and 7, the memory device 10 according to this embodiment of the invention does not distinguish between reading out "H" and "L" and follows the same steps for the readout. In other words, the readout of "L" is carried out exactly like that of "H" except that, in the case of reading out "L", the polarization condition at the time of the readout is P2. It is also different from the readout of "H" in that the polarization condition at the time of the readout is always P2 whether it is high-speed readout or low-speed readout.

When a memory content "L" is read out, the polarization condition of the memory capacitor C11 becomes P3 if the readout voltage Vp shown in FIG. 3 is applied. Accordingly, the partial voltage at the memory capacitor C11 is V2. At the moment, the potential of the bit line /BL1 is as shown in FIG. 7 at (a) with reference to the ground. Since the reference voltage Vref is set to be higher than V2, as explained above, the sense amplifier AMP1 concludes that the memory content is "L" and sets the voltage of the bit line /BL1 at "L" (as shown in FIG. 7 at (b)).

As the bit line /BL1 is set at "L", there appears a potential difference between the bit line /BL1 and the plate line PL1 kept at "H". This potential difference serves as the second rewrite voltage Vrw2 (which is equal to the readout voltage Vp) which is applied to the memory capacitor C11. With the second rewrite voltage Vrw2 thus applied, the polarization condition of the memory capacitor C11 becomes P7 as shown in FIG. 3.

The plate line PL1 is then set to "L" (as shown in FIG. 7 at (c)). This forcibly makes the voltage across the memory capacitor C11 to zero, and the charges based on the paraelectric term Hp of the memory capacitor C11 as shown in FIG. 4 are forcibly discharged and the polarization condition returns to P2 shown in FIG. 3.

In summary, during the series of processes for reading a memory content of "L", the polarization condition of the memory capacitor C11 changes only from P2 to P3 to P7 to P2. Thus, the remanent polarization of the memory capacitor C11 remains P2 and does not vary. According to this embodiment of the invention, therefore, there is no shortening of the useful endurance of the memory capacitor C11 due to variations in the remanent polarization for reading out "L".

As shown in FIG. 4, furthermore, there is hardly any change in the polarization condition based on the ferroelectric term Hf during the course of changes in the polarization condition of the memory capacitor C11 from P2 to P3 to P7 to P2. Thus, neither is there hardly any shortening of the useful endurance of the memory capacitor C11 due to variations in the polarization condition based on the ferroelectric term Hf.

According to this embodiment of the invention, therefore, the useful endurance of the memory capacitor C11 is adversely affected only for reading out a memory content "H" at a low speed. When the readout is carried out at a low speed, however, the lowering of the endurance per unit time is small, as discussed above, and hence it does not become a practical problem. Moreover, readout can be carried out by the same procedure, independent of whether the readout cycle is long or short and whatever the content of memory.

Although the first embodiment of this invention was described above with reference to one particular example, many modifications and variations are still possible. For example, although parasitic capacitance of bit line was used as the load capacitor Cb in the above example, a separate capacitor may be utilized. Although a paraelectric capacitor was used as the load capacitor Cb, a capacitor of a different type may be used instead.

The capacitance of the load capacitor Cb need not be determined such that the voltage on the memory capacitor C11 be approximately zero at the time of a readout while the memory capacitor C11 is fully charged by the first rewrite voltage Vrw1. The capacitance of the load capacitor Cb may be determined such that the voltage on the memory capacitor C11 be of the same polarity as the first rewrite voltage Vrw1. Moreover, adjustments may be made on one or more from the readout voltage Vp, the first rewrite voltage Vrw1 and the hysteresis characteristic of the ferroelectric capacitor. Adjustments may likewise be made on the capacitance of the load capacitor and one or more of these elements.

Similarly, the readout voltage Vp and the second rewrite voltage Vrw2 were made equal in the example above but they may be different.

The hysteresis characteristic of the memory capacitor C11 may be, but need not be such that the polarization condition R6 based on the ferroelectric term Hf under the fully charged condition P6 by the first rewrite voltage Vrw1 and the polarization condition R1 based on the ferroelectric term Hf under the first polarization condition P1 are approximately equal. Neither is the readout procedure for the memory device 10 limited by the timing charts in FIGS. 6 and 7, and the circuit structure shown in FIG. 1 is not intended to limit the scope of the first embodiment of the invention.

Another ferroelectric memory device 10' according to a second embodiment of this invention is described next with reference to FIGS. 8 and 9 wherein components which are identical or substantially similar to those explained above with reference to the first embodiment of the invention are indicated by the same numerals or symbols for convenience and will not be explained repetitively especially since FIGS. 8 and 9 are very much similar to FIGS. 1 and 2, respectively.

In FIGS. 8 and 9, the load capacitor Cb is a ferroelectric capacitor formed on the same substrate as the ferroelectric memory capacitor C11 in the same production process, having the same characteristics such that it can be assured that they have the same characteristics even if there were fluctuations in the conditions of their production, and this significantly improves the reliability of their operations. In this example, furthermore, the first rewrite voltage Vrw1 and the readout voltage Vp (to be explained below) are set such that their absolute values are the same. As a result, the voltage on the memory capacitor C11 becomes approximately zero at the time of a readout by the first rewrite voltage Vrw1 when the memory capacitor C11 is in a fully charged polarization condition. Thus, there is hardly any variation in the remanent polarization when a memory content "H" is read out, and adverse effects on the useful endurance of the capacitor can be prevented.

The hysteresis characteristic H of the memory capacitor C11 in the circuit of FIG. 9 is also shown by FIG. 4. As explained above with reference to FIGS. 5, 6 and 7 for the first embodiment of this invention, the useful endurance of such a memory capacitor C11 is not adversely affected by changes in remanent polarization. According the this embodiment of the invention, as shown in FIG. 8, one end of the ferroelectric load capacitor Cb is grounded, the other end being connected to the bit line /BL1. As shown in FIGS. 6 and 7, the potential on the bit line /BL1 fluctuates only between "H" (corresponding to the first rewrite voltage Vrw1) and "L" (corresponding to ground potential). Thus, the voltage applied to the load capacitor Cb is always in the same direction and its magnitude is within the range of 0–Vrw1. For this reason, there is no inversion of polarization in this ferroelectric load capacitor Cb during the processes described above. In other words, even if the load capacitor Cb is a ferroelectric capacitor, the useful endurance of memory capacitor C11 is not adversely affected by the polarization inversion of the load capacitor Cb. According to a preferred embodiment, the memory capacitor C11 and the load capacitor Cb are formed on the same substrate in the same production step at the same time such that fluctuations at the production steps can be absorbed and reliability of the products can be improved, independent of the length of the readout cycle or the content of the memory being read out, although this is not intended to limit the scope of the second embodiment of the invention. The second embodiment is characterized only in that the load capacitor be a ferroelectric capacitor having substantially the same characteristics as the ferroelectric memory capacitor C11. The first rewrite voltage Vrw1 and the readout voltage Vp may be such that their absolute values are the same, or the absolute value of the readout voltage Vp may be made smaller than the absolute value of the first rewrite voltage Vrw1. Similarly, the readout voltage Vp and the second rewrite voltage Vrw2 were of the same value in the above example but they are not required to be of the same value. Likewise, the hysteresis characteristic of the ferroelectric load capacitor C11 need not be selected such that the polarization condition R6 based on the ferroelectric term Hf at the condition P6 fully charged by the first rewrite voltage Vrw1 be the same as the polarization condition R1 based on the ferroelectric term Hf at the first polarization condition P1.

Still another ferroelectric memory device according to a third embodiment of this invention is described next with reference to FIGS. 8 and 11 wherein components which are identical or substantially similar to those explained above with reference to the first and second embodiments of the invention are indicated by the same numerals or symbols for convenience and will not be explained repetitively. The reference cell driving circuit 12 of FIG. 8 serves as the readout and threshold voltage generating and applying means. The sense amplifier section 14 and the reference cell preset circuit 16 serve as the memory content judging means.

As shown more in detail in FIG. 11, the memory cell M11 comprises a ferroelectric memory capacitor C11 serving as memory means (for storing data) and a selection transistor TR11. One end of the memory capacitor C11 is electrically connected in series with a load capacitor Cb (hereinafter referred to as "the first load capacitor") through the selection transistor TR11 and a bit line /BL1. The other end of the memory capacitor C11 is connected to the reference cell drive circuit 12 (shown in FIG. 8) through plate line PL1. The gate of the selection transistor TR11 is connected to word line WL1. One end of sense amplifier AMP1 is connected to bit line /BL1, the other end of sense amplifier AMP1 being connected to the reference cell preset circuit 16 through bit line BL1.

In the reference cell preset circuit 16, one end of ferroelectric capacitor Cr for reference is electrically connected in series with another load capacitor Cc (hereinafter referred to as "the second load capacitor") through transistor TRC and bit line BL1. It is also connected to grounding line VSS through transistor TRD. The other end of the ferroelectric capacitor Cr is connected to the reference cell drive circuit 12 (shown in FIG. 8) through plate line GCP. The gate of the transistor TRC is connected to the reference cell drive circuit 12 through line RWL. The gate of the transistor TRD is connected to the reference cell drive circuit 12 through line RBP. Bit lines /BL1 and BL1 are connected to the grounding line VSS respectively through transistors TRA and TRB.

The gates of the transistors TRA and TRB are both connected to a bit line equalize circuit 13 (shown in FIG. 8).

FIG. 12 shows the hysteresis characteristic of the memory capacitor C11 of FIG. 11, that is, the relationship between its voltage and polarization condition. The voltage is represented by that of the bit line /BL1 with the plate line PL1 at reference voltage. The polarization condition is represented by the charge, which is its equivalent. With reference to FIG. 12, the condition with remanent polarization Z1 is again referred to as the first polarization condition P1 (corresponding to a first memory content "H"), and the condition with remanent polarization Z2 is similarly referred to as the second polarization condition P2 (corresponding to a second memory content "L").

According to an example shown in FIG. 11, the first rewrite voltage Vrw1 and the readout voltage Vp (to be explained below) are set such that their absolute values are equal. If they are thus set, the voltage generated across the memory capacitor C11 becomes nearly zero at the time of a readout by the first rewrite voltage Vrw1 when the memory capacitor C11 is in the fully charged polarization condition. As a result, there will be hardly any variation in the remanent polarization in the memory capacitor C11 at the time of reading out a memory content "H" at a high speed, and this serves to prevent adverse effects on the useful endurance of the capacitor.

The hysteresis H shown in FIG. 4 of the memory capacitor C11 of FIG. 11 is also considered as the synthesis of a ferroelectric term Hf having a hysteresis characteristic and a paraelectric term Hp having no hysteresis characteristic. Let R6 be the polarization condition based on the ferroelectric term Hf in the condition P6 when it is fully charged by a (first) rewrite voltage Vrw1 and R1 be the polarization condition based on the ferroelectric term Hf in a first polarization condition P1. The hysteresis of the memory capacitor C11 is so determined that the polarization conditions R6 and R1 are approximately the same. In other words, the memory capacitor C11 has a high susceptibility, that is, the ferroelectric term Hf having a steep rise. If a ferroelectric capacitor with such a hysteresis characteristic is used, there is hardly any variation in the polarization condition due to the ferroelectric term Hf when the memory content "H" is read out at a fast rate, as will be explained below. This serves to prevent the shortening of the useful endurance.

If a ferroelectric capacitor with low susceptibility, as shown by FIG. 5, is used, the difference (indicated by "d") between the polarization conditions R6 and R1 becomes larger. Thus, if memory contents "H" are read out at a fast rate from a ferroelectric capacitor with such a hysteresis characteristic, the change in the polarization condition due to the ferroelectric term Hf is large, and this affects the useful endurance adversely. In summary, it is preferred that the polarization condition R1 based on the ferroelectric term Hf at the first polarization condition P1 be at least greater than 80% of the polarization condition R6 based on the ferroelectric term Hf at completely charged condition P6 by the first rewrite voltage Vrw1.

FIG. 13 shows the hysteresis curve of the ferroelectric capacitor Cr relating the voltage (or the potential of the bit line BL1 when the plate line GCP is taken as reference potential with reference to FIG. 11) and its polarization condition (represented by the equivalent charge). According to a preferred embodiment of the invention, the capacitors Cr, Cc, C11 and Cb are all formed on the same substrate and fabricated at the same time such that, even if there were fluctuations during their production processes, these fluctuations are mutually compensated for such that variations associated with such fluctuations during their production will have no significant effect. The capacitors C11, Cb and Cc are preferably designed such that they have approximately the same hysteresis characteristics such that they are guaranteed to have the same characteristics and the reliability of their functions is improved.

FIG. 13 shows, however, the capacitors Cr and Cc as not having the same hysteresis characteristics. The reference voltage Vref can be determined by combining the hysteresis characteristics of these two capacitors, as will be described below. FIG. 13 shows a combination wherein the area (the effective area of mutually opposite electrode plates) of the ferroelectric capacitor Cr is about 1.7 times as large as that of the load capacitor Cc. In the example of FIG. 13, the reference voltage Vref with respect to the ground potential is about 3.6 V (about −1.6 V with respect to the potential of the plate line PL1).

If the ratio of the area of the ferroelectric capacitor Cr is increased, the reference voltage Vref is also increased as shown in FIG. 14. If this ratio is reduced, on the other hand, the reference voltage Vref also becomes smaller as shown in FIG. 15. FIG. 16 shows the relationship between the ratio of area and the reference voltage Vref, indicating how the reference voltage Vref increases as the ratio of the area of the ferroelectric capacitor Cr is increased. According to the illustrated example, the reference voltage Vref becomes the average of the partial voltages V1 and V2 with respect to the ground potential (to be explained below) if the area ratio is about 1.4, increasing the margin of detection when reading out the memory content (also to be explained in detail below).

It is noted that the curve shown in FIG. 16 is convex to the top. Thus, the change in the reference voltage Vref corresponding to a change in the area ratio becomes smaller as the reference voltage Vref approaches the partial voltage V1 (or as the area ratio becomes larger). In other words, the reference voltage Vref should be made larger in order to reduce the variations in the reference voltage Vref caused by the fluctuations in the area ratio. It is preferable to set the reference voltage Vref close to the average of V1 and V2 or somewhat closer to V1. If it is so set, a safety margin of detection can be maintained when reading out a memory content even if the fluctuation in the area ratio is large due to the production process. According to the illustrated example, the area ratio is about 1.7, and FIG. 16 shows that there will be no readout error if the variations in the area ratio are by less than about ±0.6.

Next will be explained the operations for reading out the memory content from the memory device of FIGS. 8 and 11. For reading out the memory content of the memory cell M11 shown in FIG. 11, its address is first inputted to the address buffer 18 such that the memory cell M11 will be selected through a column decoder 20 for selecting a column and a row decoder 22 for selecting a row.

Operations for reading out a memory content "H" will be described next with reference to the timing chart in FIG. 17 together with FIGS. 8, 11, 12 and 13. A situation of high-speed readout whereby the readout takes place when the memory capacitor C11 is in the fully charged polarization condition P6 (as shown in FIG. 12) by the first rewrite voltage Vrw1 (to be explained below) will be explained.

First, the bit line equalize circuit 13 (shown in FIG. 8) holds the line BP at "H" for a specified length of time and then returns it to "L" (as shown in FIG. 17 at (a)). Transistors TRA and TRB (shown in FIG. 11) are thereby switched on for a while, connecting the grounding line VSS to bit lines /BL1 and BL1 and setting the bit lines /BL1 and BL1 to "L" (as shown in FIG. 17 at (b) and (c)). As the bit lines /BL1 and BL1 are kept at "L" for a specified length of time, the load capacitors Cb and Cc are discharged. Thereafter, the transistors TRA and TRB are switched off and the bit lines /BL1 and BL1 are set in a floating condition (as shown in FIG. 17 at (d) and (e)).

As the line BP is kept at "H" for a specified length of time, line RBP shown in FIG. 11 is simultaneously kept at "H" by the reference cell drive circuit 12 (shown in FIG. 8) and then returned to "L" (as shown in FIG. 17 at (y)). As a result, transistor TRD is switched on for a while, connecting one end of the ferroelectric capacitor Cr with the grounding line VSS and setting it to "L". The plate line GCP to which the other end of the ferroelectric capacitor Cr is connected is at "L" at this moment (as shown in FIG. 17 at (z)). Thus, the ferroelectric capacitor Cr is forcibly put in the polarization condition P11 as shown in FIG. 13, independent of its earlier polarization condition.

Next, the reference cell drive circuit 12 sets the plate lines PL1 and GCP to "H" (as shown in FIG. 17 at (f) and (g)) such that a high voltage "H" (corresponding to the readout voltage Vp and the threshold generating voltage Vr) is applied to the other ends of the ferroelectric capacitors C11 and Cr.

Next, the word line WL1 is set to "H" (as shown in FIG. 17 at (h)) such that the selection transistor TR11 is switched on, electrically connecting the memory capacitor C11 and the load capacitor Cb in series. This means that the readout voltage Vp is now applied to the ends of the memory capacitor C11 and the load capacitor Cb which are connected together, generating a partial voltage V3 across the memory capacitor C11. According to an analysis from the graph, the partial voltage V3 may be given as the voltage of the memory capacitor C11 at the first polarization condition P1, or V3=0. The potential of the bit line /BL1 with respect to the ground is as shown in FIG. 17 at (i).

As the word line WL1 is set to "H" as described above, the line RWL is set to "H" by the reference cell drive circuit 12 (as shown in FIG. 17 at (j)), thereby switching on the transistor TRC and electrically connecting the memory capacitor C11 and the load capacitor Cc in series. Thus, a threshold generating voltage Vr (equal to the readout voltage Vp in this example) is applied to the ends of the memory capacitor C11 and the load capacitor Cc which are connected together.

As explained above, the ferroelectric capacitor Cr is in polarization condition P11 shown in FIG. 13 immediately before it is connected. Thus, a partial voltage (reference voltage Vref) based on the threshold generating voltage Vr is generated across the ferroelectric capacitor Cr as it is connected with the load capacitor Cc. By analyzing FIG. 13, the reference voltage Vref is given as the voltage of the ferroelectric capacitor Cr in the polarization condition P12. Accordingly, the potential of the bit line BL1 with respect to the ground becomes as shown in FIG. 17 at (k).

Next, the sense amplifier AMP1 is activated (as shown in FIG. 17 at (1)). The sense amplifier AMP serves to compare the reference voltage Vref (threshold voltage) provided by the reference cell preset circuit 16 through the bit line BL1 and the partial voltage V3 (described above) of the memory capacitor C11 (that is, the potential of reference voltage Vref with respect to the readout voltage Vp shown in FIG. 12 and the potential of the partial voltage V3). If the partial voltage V3 is higher, it is concluded that the memory content is "H", setting the potential of the bit line /BL1 to "H" (as shown in FIG. 17 at (m)) and the potential of the bit line BL1 to "L" (as shown in FIG. 17 at (n)). At this moment, the polarization condition of the memory capacitor C11 remains at P1 shown in FIG. 12. The polarization condition of the ferroelectric capacitor Cr is P13 as shown in FIG. 13.

Next, the line RWL is set to "L" according to an output from the reference cell drive circuit 12 (shown in FIG. 8) (as shown in FIG. 17 at (o)), setting the ferroelectric capacitor Cr in a floating condition. Thus, with the elapse of time thereafter, the ferroelectric capacitor Cr approaches the polarization condition P11 shown in FIG. 13 through natural discharge.

Next, the plate lines PL1 and GCP are set to "L" (as shown in FIG. 17 at (p) and (q)) according to an output from the reference cell drive circuit 12 (shown in FIG. 8). As the plate line PL1 is set to "L", there appears a potential difference between the plate line PL1 and the bit line /BL1 maintained at "H". This potential difference represents the first rewrite voltage Vrw1 shown in FIG. 12 applied across the memory capacitor C11. The polarization condition of the memory capacitor C11 thereby becomes P6, shown in FIG. 12, which is a fully charged condition. Since the ferroelectric capacitor Cr is in a floating condition, as explained above, there is no change in the polarization condition of the ferroelectric capacitor Cr as the plate line GCP is set to "L".

Next, the word line WL1 is dropped to "L" (as shown in FIG. 17 at (r)) while the memory capacitor C11 is in the fully charged condition by the first rewrite voltage Vrw1 so as to switch off the selection transistor TR11 and set the memory capacitor C11 in a floating condition.

Next, the output line B1 (shown in FIG. 8) of the row decoder 22 is raised (as shown in FIG. 17 at (s)) to take the potential level "H" of the bit line /BL1 (as shown in FIG. 17 at (t)) into the output buffer 24. The sense amplifier AMP1 is thereafter switched off (as shown in FIG. 17 at (u)) to set the bit lines /BL1 and BL1 in a floating condition again (as shown in FIG. 17 at (v) and (w)). Finally, the output line B1 of the row decoder 22 is returned to "L" (as shown in FIG. 17 at (x)) to complete the readout process.

In such a case of high-speed readout with a short cycle, wherein the next readout takes place after the memory capacitor C11 is fully charged by the rewrite voltage Vrw1 and before it is discharge, the polarization condition of the memory capacitor C11 changes only from P6 to P1 to P6 during the course of readout processes described above. As a result, the remanent polarization of the memory capacitor C11 remains in the first polarization condition P1 and does not change. In this example, therefore, the useful endurance of the memory capacitor C11 will not be adversely affected by variations in the polarization condition at the time of high-speed readout.

As shown in FIG. 4, furthermore, neither is there hardly any variation in the polarization condition based on the ferroelectric term Hf while the polarization condition of the memory capacitor C11 changes from P6 to P1 to P6. In this example, therefore, there is hardly any adverse effect on the useful endurance of the memory capacitor C11 due to the variations in the polarization condition based on the ferroelectric term Hf.

As described above, the polarization condition of the ferroelectric capacitor Cr changes only from P11 to P12 to P13 (and to P11) during the series of readout processes. Thus, the remanent polarization of the ferroelectric capacitor Cr remains P11 and does not vary. In this example, therefore, there is no adverse effect on the useful endurance of the ferroelectric capacitor Cr due to variations in the remanent polarization during a high-speed readout.

Next will be explained the processes of slowspeed readout at a long cycle wherein the readout takes place when the paraelectric term Hp of the memory capacitor C11 (as shown in FIG. 4) is in the totally discharged condition, or in the first polarization condition P1.

The memory device according to this embodiment carries out readouts by the same processes, without distinguishing whether it is a high-speed readout or a low-speed readout. In other words, a low-speed readout is carried out by the same procedure as the high-speed readout. As a result, the reference voltage Vref is the same as in the case of high-speed readout described above. In the case of low-speed readout, however, the polarization condition of the memory capacitor C11 at the time of a readout is the first polarization condition P1, as shown in FIG. 12, not P6 as in the highspeed readout, and this is the only difference.

Accordingly, when the readout voltage Vp shown in FIG. 12 is applied at the time of a low-speed readout, the polarization condition of the memory capacitor C11 is P4, and the partial voltage across the memory capacitor C11 is V1. The potential of the bit line /BL1 at this moment with reference to the ground is as shown in FIG. 17 at (i'). Since the reference voltage Vref is set below V1 as described above, however, the sense amplifier AMP1 concludes, as in the case of highspeed readout, that the memory content is "H", setting the bit line /BL1 at "H" (as shown in FIG. 17 at (m)) and the bit line BL1 at "L" (as shown in FIG. 17 at (n)). At this moment, the polarization condition of the memory capacitor C11 is P5, as shown in FIG. 12.

A rewrite is carried out thereafter by applying the first rewrite voltage Vrw1 across the memory capacitor C11 (as shown in FIG. 17 at (p)). The polarization condition of the memory capacitor C11 thereby becomes P6. After the readout is completed, the charges based on the paraelectric term Hp shown in FIG. 4 of the memory capacitor C11 are completely discharged with time and the first polarization condition P1 shown in FIG. 12 is reached.

Thus, the remanent polarization varies from P1 to P5 to P1 at the time of a slow-speed readout and, as the polarization condition of the memory capacitor C11 changes from P1 to P4, the polarization condition based on the ferroelectric term Hf also changes from R1 to R4. Thus, there will be shortening of the useful endurance of the memory capacitor C11 when reading out "H" at a low speed. When the readout is at a slow speed, however, this does not become a problem because the number of readouts per unit time is small and hence the shortening of the endurance per unit time is also small.

The operations by the ferroelectric capacitor Cr are the same as in the case of high-speed readout. Thus, the remanent polarization of the ferroelectric capacitor Cr is P11 and does not change even in the case of low-speed operation, and there is no adverse effect on the useful endurance due to variations in remanent polarization at the time of low-speed readout.

Next will be explained the operations for reading out a memory content "L". As shown in FIGS. 17 and 18, the memory device 10' according to this invention are adapted to function identically for a readout without distinguishing whether it is reading out a memory content "H" or "L". In other words, the readout of a memory content "L" is carried out as that of a memory content "H". In the case of reading out "L", however, the memory capacitor C11 is in the second polarization condition P2 at the time of readout. In this example, it is so adapted that the polarization condition will be always P2 when reading out a memory content "L" whether by high-speed readout or slow-speed readout.

When the readout voltage Vp shown in FIG. 12 is applied for reading a memory content "L", the memory capacitor C11 shows the polarization condition of P3, and its partial voltage is V2. At this moment, the potential of the bit line /BL1 with respect to the ground is as shown in FIG. 18 at (a). On the other hand, the potential of the bit line BL1 becomes the same as the reference voltage Vref as in the case of memory content "H" (as shown in FIG. 18 at (b)) but, since the reference voltage Vref is set at a level higher than V2, the sense amplifier AMP1 concludes that the memory content is "L" and sets the potential of the bit line /BL1 to "L" (as shown in FIG. 18 at (c)) and the potential of the bit line BL1 to "H" (as shown in FIG. 18 at (d)).

As the potential of the bit line /BL1 is set at "L", a potential difference is generated between the bit line /BL1 and the plate line PL1 maintained at "H". This potential difference is the second rewrite voltage Vrw2 (equal to the readout voltage Vp) which is applied to the memory capacitor C11. When the second rewrite voltage Vrw2 is applied, the polarization condition of the memory capacitor C11 becomes P7.

As the potential of the bit line BL1 is set at "H", however, there arises no potential difference between the bit line BL1 and the plate line GCP maintained at "H". In other words, the voltage across the memory capacitor C11 is zero and the polarization condition of the ferroelectric capacitor Cr is forcibly returned from P12 to P11 as shown in FIG. 13.

The plate line PL1 is thereafter set to "L"(as shown in FIG. 18 at (e)) to forcibly set the voltage on the memory capacitor C11 equal to zero. As a result, the charges based on the paraelectric term Hp (shown in FIG. 4) of the memory capacitor C11 become completely discharged and the second polarization condition P2 shown in FIG. 12 is reached.

In summary, the polarization condition of the memory capacitor C11 changes only from P2 to P3 to P7 to P2 during the series of readout operations for reading out a memory content "L" as shown in FIG. 12. Thus, the remanent potential of the memory capacitor C11 remains at the second polarization condition P2 without changing. Therefore, the useful endurance of the memory capacitor C11 is not adversely affected due to the variations in remanent potential for reading out memory content "L". Neither is there hardly any variation in the polarization condition based on the ferroelectric term Hf while the polarization condition of the memory capacitor C11 changes from P2 to P3 to P7 to P2, as shown in FIG. 4. Accordingly, neither is there hardly any adverse effect on the useful endurance of the memory capacitor C11 due to variations in the polarization condition based on the ferroelectric term Hf for reading memory content "L".

As for the ferroelectric capacitor Cr, its polarization condition changes only from P11 to P12 to P11, as shown in FIG. 13. Thus, its remanent polarization remains at P11, without undergoing any variations. In other words, there is no shortening in the useful endurance due to the variation in the remanent polarization for reading memory content "L".

In summary, the useful endurance of the memory capacitor C11 is adversely affected only when reading out memory content "H" at a low speed, but the low-speed reading does not present any serious problem because the lowering of the useful endurance per unit time is insignificant in the case of a low-speed readout. Moreover, there is no adverse effect on the useful endurance of the ferroelectric capacitor Cr whether the memory content is "H" or "L", as described above.

As shown in FIG. 11, furthermore, one end of the load capacitor Cb is grounded and the other end is connected to the bit line /BL1, while, as shown in FIGS. 17 and 18, the potential of the bit line moves only between "H" (corresponding to the first rewrite voltage Vrw1) and "L" (corresponding to the ground potential) during each operation described above. Thus, the voltage applied across the load capacitor Cb is always in the same direction, changing between zero and Vrw1, causing no inversion of polarization during the various operations described above. In summary, although the load capacitor Cb comprises a ferroelectric material in this example, its useful endurance is not adversely affected due to the inversion of polarization. The same is also true with the load capacitor Cc.

If all capacitors C11, Cr, Cb and Cc are formed on the same substrate in a same production process, the fluctuations at the time of fabrication can be absorbed, and the reliability of the product can be improved. Another advantage is that readout can be effected by the same process whether the readout cycle is long or short and independent of the memory content.

Although the third embodiment of the invention was described above with reference to an example (as shown in FIGS. 13 and 16) wherein the area ratio between the capacitors Cr and Cc is about 1.7, the area ratio is not limited to this value but may be selected such that the reference voltage Vref will be near the average value of partial voltages V1 and V2 or somewhat closer to V1.

Although many preferred conditions have been mentioned throughout herein, they are not intended to limit the scope of the invention. For example, the capacitors C11, Cr, Cb and Cc need not necessarily be set on the same substrate or produced in a same production step. The absolute values of the first rewrite voltage Vrw1 and the readout voltage Vp need not be the same. Similarly, the readout voltage Vp and the second rewrite voltage Vrw2 need not necessarily be set equal to each other, and the readout voltage Vp need not necessarily be set equal to the threshold generating voltage Vr. Moreover, the hysteresis characteristic of the memory capacitor C11 need not necessarily be selected such that the polarization condition R6 based on the ferroelectric term Hf at the fully discharged condition P6 by the first rewrite voltage Vrw1 should be about equal to the polarization condition R1 based on the ferroelectric term Hf at the first polarization condition P1. Neither the timing charts in FIGS. 17 and 18 nor even the structure of the memory device itself is intended to limit the scope of the invention. All modifications and variations of the description given above, which may be apparent to a person skilled in the art, are intended to be within the scope of this invention.

What is claimed is:

1. A ferroelectric memory device comprising:

a ferroelectric memory capacitor having a hysteresis characteristic defining a relationship between applied voltage and polarization condition, said memory capacitor being adapted to store selectively, based on said hysteresis characteristic, either a first memory content corresponding to a first polarization condition or a second memory content corresponding to a second polarization condition when applied voltage is zero;

a first load capacitor which is electrically connected in series with said memory capacitor;

a ferroelectric reference capacitor; and a second load capacitor which is electrically connected in series with said reference capacitor, said first and second load capacitors being each a ferroelectric capacitor having substantially same characteristics as said memory capacitor;

wherein the ratio of area between said reference capacitor and said second load capacitor is such that Vref is nearly equal to the average of V1 and V2 or slightly closer to V1 from said average, where Vref is the partial voltage which appears across said reference capacitor if a specified voltage is applied to said reference capacitor and said second load capacitor connected to each other in series, where V1 is the partial voltage which appears across said memory capacitor if said specified voltage is applied to said memory capacitor and said first load capacitor connected to each other in series when said memory capacitor is in said first polarization condition, and where V2 is the partial voltage which appears across said memory capacitor if said specified voltage is applied to said memory capacitor and said first load capacitor connected to each other in series when said memory capacitor is in said second polarization condition.

2. The ferroelectric memory device of claim 1 wherein said memory capacitor, said reference capacitor, said first load capacitor and said second load capacitors are all ferroelectric capacitors set on a same substrate and were produced at a same time in a same production process.

3. The ferroelectric memory device of claim 1 further comprising:

a voltage applying means for applying said specified voltage as a readout voltage to said memory capacitor and said first load capacitor connected electrically to each other in series, said specified voltage having a polarity which is different from the polarity of a voltage which results in said first polarization condition and applying a same voltage as said readout voltage as a threshold-voltage-generating voltage to said reference capacitor and said second load capacitor connected electrically to each other in series; and a memory content judging means for judging the memory content of said memory capacitor on the basis of a first partial voltage generated at said memory capacitor when said readout voltage is applied and a second partial voltage generated at said reference capacitor when said threshold-voltage-generating voltage is applied.

4. The ferroelectric memory device of claim 2 further comprising:

a voltage applying means for applying said specified voltage as a readout voltage to said memory capacitor and said first load capacitor connected electrically to each other in series, said specified voltage having a polarity which is different from the polarity of a voltage which results in said first polarization condition and applying a same voltage as said readout voltage as a threshold-voltage-generating voltage to said reference capacitor and said second load capacitor connected electrically to each other in series; and a memory content judging means for judging the memory content of said memory capacitor on the basis of a first partial voltage generated at said memory capacitor when said readout voltage is applied and a second partial voltage generated at said reference capacitor when said threshold-voltage-generating voltage is applied.

5. The ferroelectric memory device of claim 3 wherein said reference capacitor and said second load capacitor are electrically connected in series to each other only when said voltage applying means is applying said threshold-voltage-generating voltage.

6. The ferroelectric memory device of claim 4 wherein said reference capacitor and said second load capacitor are electrically connected in series to each other only when said voltage applying means is applying said threshold-voltage-generating voltage.

* * * * *